(12) United States Patent
Maruyama et al.

(10) Patent No.: US 8,767,109 B2
(45) Date of Patent: *Jul. 1, 2014

(54) SOLID-STATE IMAGE PICKUP DEVICE

(71) Applicant: Sony Corporation, Tokyo (JP)

(72) Inventors: Shunsuke Maruyama, Kanagawa (JP); Junichiro Fujimagari, Kanagawa (JP); Toshifumi Wakano, Kanagawa (JP); Torii Motonobu, Fukuoka (JP); Hoshi Hironori, Kanagawa (JP); Kikuchi Koji, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/655,132

(22) Filed: Oct. 18, 2012

(65) Prior Publication Data

US 2013/0038768 A1  Feb. 14, 2013

Related U.S. Application Data

(62) Division of application No. 11/657,783, filed on Jan. 24, 2007, now Pat. No. 8,355,069.

(30) Foreign Application Priority Data

Jan. 27, 2006  (JP) ................... 2006-019367

(51) Int. Cl.
*H04N 5/335*  (2011.01)
(52) U.S. Cl.
USPC .................... 348/302; 348/315; 348/308

(58) Field of Classification Search
CPC ....... H04N 5/335; H04N 5/378; H04N 3/155; H04N 9/045; H01L 27/14643; H01L 27/14603; H01L 27/14609; H01L 27/1462
See application file for complete search history.

(56) References Cited

U.S. PATENT DOCUMENTS

| | | | |
|---|---|---|---|
| 6,731,335 B1 * | 5/2004 | Kim et al. ..................... | 348/308 |
| 6,806,904 B1 | 10/2004 | Kim | |
| 6,933,972 B2 * | 8/2005 | Suzuki et al. ................. | 348/302 |
| 2003/0010981 A1 | 1/2003 | Sekine | |
| 2004/0007754 A1 * | 1/2004 | Adachi et al. ................. | 257/443 |
| 2004/0046881 A1 * | 3/2004 | Utagawa ....................... | 348/294 |
| 2005/0128327 A1 | 6/2005 | Bencuya et al. | |
| 2006/0163448 A1 * | 7/2006 | Sugiyama et al. ......... | 250/208.1 |

FOREIGN PATENT DOCUMENTS

| | | |
|---|---|---|
| JP | 2000-101061 | 4/2000 |
| JP | 2001-213350 | 8/2001 |
| JP | 2001-230400 | 8/2001 |
| JP | 2003-007995 | 1/2003 |
| JP | 2003-249632 | 9/2003 |
| JP | 2003-259232 | 9/2003 |
| JP | 2004-172950 | 6/2004 |
| JP | 2005-142251 | 6/2005 |

* cited by examiner

*Primary Examiner* — Luong T Nguyen
(74) *Attorney, Agent, or Firm* — Rader, Fishman & Grauer PLLC

(57) ABSTRACT

A solid-state image pickup device includes pixels diagonally arranged, each including a photoelectric conversion unit and a plurality of transistors and wiring extending in the vertical and horizontal directions which is diagonally arranged around the photoelectric conversion unit in each of the pixels so that at least one portion of the wiring is arranged along at least one side of the photoelectric conversion unit.

13 Claims, 23 Drawing Sheets

SOLID-STATE IMAGE PICKUP DEVICE

CROSS REFERENCES TO RELATED APPLICATIONS

The subject matter of application Ser. No. 11/657,783, is incorporated herein by reference. The present application is a Divisional of U.S. Ser. No. 11/657,783, filed Jan. 24, 2007, which claims priority to Japanese Patent Application JP 2006-019367 filed in the Japanese Patent Office on Jan. 27, 2006, the entire contents of which are incorporated herein by reference.

BACKGROUND OF THE INVENTION

1. Field of the Invention

The present invention relates to solid-state image pickup devices. In particular, the present invention relates to a solid-state image pickup device such as a CMOS (complementary metal oxide semiconductor) image sensor having pixels each including a conversion unit converting charge generated by a photoelectric conversion unit into pixel signals. Such a CMOS image sensor is produced by applying or appropriately employing a CMOS process.

The solid-state image pickup device can be an element type formed as one chip or be composed of a plurality of chips.

2. Description of the Related Art

CMOS image sensors have a plurality of pixels arranged two-dimensionally, each including a photoelectric conversion unit and a plurality of MOS transistors. The CMOS image sensors convert charge generated by the photoelectric conversion unit into pixel signals and read out the pixel signals. Recently, attention has been focused on such CMOS image sensors as image pickup elements applied to devices such as cameras in mobile phones, digital still cameras, and digital video cameras.

Referring to FIG. 22, an example of a configuration of a CMOS image sensor (equivalent circuit) is illustrated. A CMOS image sensor 1 includes an image pickup area 4 having a plurality of pixels 3 arranged two-dimensionally on a semiconductor substrate. Each of the pixels 3 includes a photoelectric conversion unit, i.e., a photodiode 2 for performing photoelectric conversion, and a plurality of MOS transistors for selectively reading out a signal from the photodiode 2. In addition, the CMOS image sensor 1 is provided with peripheral circuits for selecting the pixels and outputting signals. The peripheral circuits are arranged around the image pickup area 4 on the semiconductor substrate. In this example, the MOS transistors of each of the pixels 3 in the image pickup area 4 include a transfer transistor 8, a reset transistor 9, and an amplifying transistor 10. The peripheral circuits include a circuit for selecting pixels (vertical scanning circuit) 5 and an output circuit (horizontal scanning/outputting circuit) 6 which are formed using CMOS transistors.

In FIG. 22, for each of the pixels 3, the photodiode 2 is connected to the source of the transfer transistor 8. A transfer line 11 is connected to the gate of the transfer transistor 8. The drain of the transfer transistor 8 is connected to the source of the reset transistor 9. A so-called floating diffusion provided between the drain of the transfer transistor 8 and the source of the reset transistor 9 is connected to the gate of the amplifying transistor 10. The gate of the reset transistor 9 is connected to a reset line 12. In addition, a power source line 13 for supplying electric power is connected to the drain of the reset transistor 9 and the drain of the amplifying transistor 10. The source of the amplifying transistor 10 is connected to a vertical signal line 14.

In this CMOS image sensor 1, for each of the pixels 3, photoelectric conversion is performed by the photodiode 2. The transfer transistor 8 transfers photoelectrons (signal charge) in the photodiode 2 to the floating diffusion FD. Since the floating diffusion FD is connected to the amplifying transistor 10, a signal corresponding to the potential of the floating diffusion FD is output through the amplifying transistor 10 to the vertical signal line 14.

As an example of a layout of the pixels 3, Japanese Unexamined Patent Application Publication No. 2003-007995 discloses a layout in which a pixel group is arranged so as to be shifted in the horizontal and vertical directions by one-half of a predetermined pitch with respect to another pixel group so as to form a diagonal grid, as illustrated in FIG. 23. With a CMOS image sensor having this diagonal pixel array and signal processing, the number of recording pixels exceeds the number of effective pixels, which permits an increase in resolution.

As illustrated in FIG. 23, in a CMOS sensor with such a diagonal pixel array, individual wires are normally arranged in the vertical and horizontal directions with respect to the chip and image-pickup area, as in other types of sensor. For example, the CMOS sensor has a multilayer wiring structure constituted by a first layer of vertical wiring, a second layer of horizontal wiring, and a third layer of wiring used as power source wiring and also as a light shield. FIG. 23 illustrates only vertical lines 16 and 17 disposed on the first layer.

On the other hand, Japanese Unexamined Patent Application Publication No. 2000-101061 discloses a frame transfer CCD image sensor in which combinations of metal or metal silicide auxiliary electrodes are disposed at equal intervals so as to be diagonally oriented with respect to transfer electrodes formed of polycrystalline silicon. This configuration is proposed with a view to minimizing the area covered by the light shielding auxiliary electrodes in a light receiving portion, and thus realizing both efficient light reception/image-pickup and high-speed, highly efficient charge transfer with supply of transfer voltage to the transfer electrodes.

SUMMARY OF THE INVENTION

As described above, lines in a CMOS image sensor are arranged in the vertical and horizontal directions with respect to the chip or image pickup area. However, when miniaturization of pixels is promoted, or when a pixel transistor is shared by a plurality of photodiodes, light incident on each photodiode may be obstructed, particularly in a CMOS image sensor having a diagonal pixel array. In addition, vertical and horizontal lines (for example, the vertical lines 16 and 17 in FIG. 23) limit wiring layout possibilities, and thus the area occupied by photodiodes has to be reduced.

The present invention has been made in view of the above circumstances. Accordingly, there is a need for a solid-state image pickup device with a diagonal pixel array which prevents obstruction of light incident on a photoelectric conversion unit and thus allows an increase in a light-receiving aperture ratio of a photoelectric conversion unit.

A solid-state image pickup device according to an embodiment of the present invention is provided with pixels each having a photoelectric conversion unit and a plurality of transistors which are diagonally arranged, and with wiring extending in the vertical and horizontal directions which is diagonally arranged around the photoelectric conversion unit in each of the pixels so that at least one portion of the wiring is arranged along at least one side of the photoelectric conversion unit.

In a solid-state image pickup device according to an embodiment of the present invention, for each of the pixels, lines extending in the vertical and horizontal directions are disposed on pixels diagonally arrayed so as to lie diagonally along sides of a photoelectric conversion unit when reaching around the photoelectric conversion unit. With this arrangement, obstruction of light collection of the photoelectric conversion unit can be prevented.

In a solid-state image pickup device according to an embodiment of the present invention, obstruction of light incident on a photoelectric conversion unit can be prevented, and an increase in the light receiving aperture ratio of the photoelectric conversion unit is permitted. With this arrangement, efficiency in light collection can be improved and thus light sensitivity can be increased.

DESCRIPTION OF THE PREFERRED EMBODIMENTS

In the following, the preferred embodiments of the present invention will be described with reference to the accompanying drawings.

Figure 1:
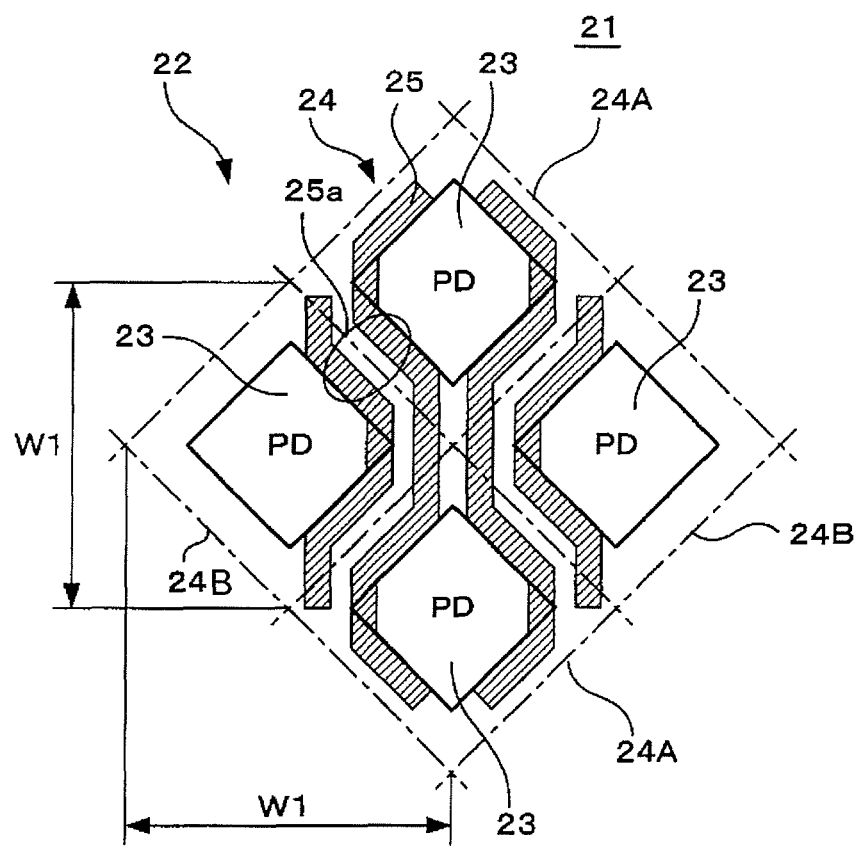
FIG. 1 is a schematic diagram illustrating a wiring layout of a CMOS-type solid-state image pickup device according to an embodiment of the present invention.

FIG. 1 illustrates a solid-state image pickup device according to an embodiment of the present invention, that is, a CMOS image sensor according to a first embodiment. The figure schematically illustrates a wiring layout in an image pickup area using an example of lines arranged in the vertical direction. A CMOS image sensor 21 according to the present embodiment includes a plurality of pixels 24 each having a photodiode (PD) 23 serving as a photoelectric conversion unit and a plurality of MOS transistors (not shown). The pixels 24 are diagonally and two-dimensionally arranged forming a so-called diagonal pixel array. Specifically, the CMOS image sensor 21 includes a first pixel group 23A, which includes a plurality of pixels 24A two-dimensionally arranged in a grid-like pattern at a predetermined pitch W1 in the vertical and horizontal directions, and a second pixel group, which includes a plurality of pixels 24B two-dimensionally arranged in a similar grid-like pattern. Each of the pixels 24B of the second pixel group is arranged at a position shifted by approximately one-half of the pitch W1 with respect to the individual pixels 24A in the vertical and horizontal directions. Thus, the pixels 24A and pixels 24B are arranged to form a square grid which is uniformly diagonally oriented. In this example, the pixels 24A are arranged in the odd-numbered rows of the grid and the pixels 24B are arranged in the even-numbered rows of the grid which are shifted by one-half of the pitch W1 with respect to the odd-numbered rows.

In the present embodiment, for each of the pixels 24, a line 25 extending in the vertical direction with respect to the image pickup area 22 obliquely lies along sides of the photodiode 23. Specifically, the line 25 is arranged so as to pass between the photodiode 23 of one of the pixels 24 and the photodiode 23 of an adjacent one of pixels 24 and to have a diagonal wiring portion 25a which is disposed linearly along the sides of the photodiode 23 while avoiding covering the photodiode 23 as much as possible. Other lines extending in the horizontal directions are similarly arranged so that the lines around the photodiode 23 are diagonally arranged along the sides of the photodiode 23, although this is not illustrated in the figure. That is, the line 25 passes between the photodiode 23 of one of the pixels 24 and the photodiodes 23 of an adjacent one of the pixels 24 and has a diagonal wiring portion 25a which lies along the sides of the photodiode 23, so as to avoid covering the photodiode 23 as much as possible.

Figure 3:
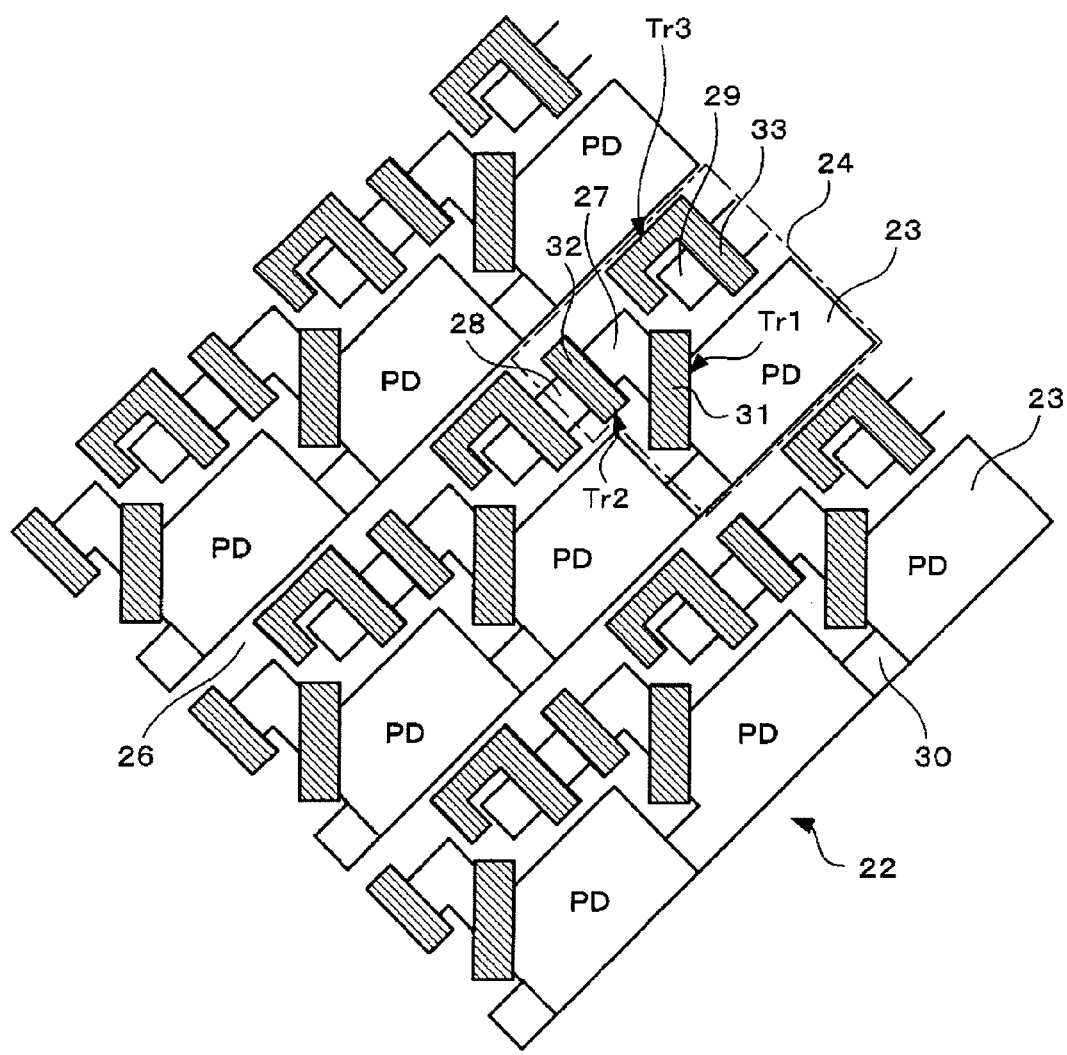
FIG. 3 is a plan view illustrating a detailed configuration of a solid-state image pickup device according an embodiment of the present invention without wiring.

Referring to FIG. 3 to FIG. 7, the first embodiment of the present invention will further be described. FIG. 3 illustrates a layout of the pixels 24 in the image pickup area 22. In this embodiment, a second conductive-type semiconductor well region (for example, a p-type semiconductor well region) is disposed on a first conductive-type semiconductor substrate (for example, an n-type semiconductor silicon substrate).

Unit pixels 24 each including the photodiode (PD) 23 serving as a photoelectric conversion unit and three MOS transistors (i.e., a transfer transistor Tr1, a reset transistor Tr2, and an amplifying transistor Tr3) are disposed regularly and two-dimensionally on the p-type semiconductor well region so as to form the diagonal pixel array described above. Device isolation regions 26 are arranged between the individual adjacent one of the pixels 24 and within each of the pixels 24. In addition, a well contact is provided in the image pickup area 22 for applying an appropriate potential to the semiconductor well region in each of the pixels 24 to stabilize the potential of the region.

The transfer transistor Tr1 includes the photodiode 23, a source/drain region (drain region, in this example) 27 serving as a floating diffusion FD, and a transfer gate electrode 31 on a gate insulating film disposed on the p-type semiconductor well region. The reset transistor Tr2 includes a pair of the source/drain region (source region, in this example) 27 and a source/drain region (drain region, in this example) 28, and a reset gate electrode 32 disposed on the gate insulating film. The amplifying transistor Tr3 includes a pair of a source/drain region (drain region, in this example) 28 and a source/drain region (source region, in this example) 29 and an amplifying gate electrode 33 disposed on the gate insulating film.

In this example, first-layer metal wiring to third-layer metal wiring are arranged on the semiconductor substrate on which the photodiode 23 and the three MOS transistors Tr1 to Tr3 are arranged. An interlayer insulating film is arranged between the individual metal wiring.

Figure 4:
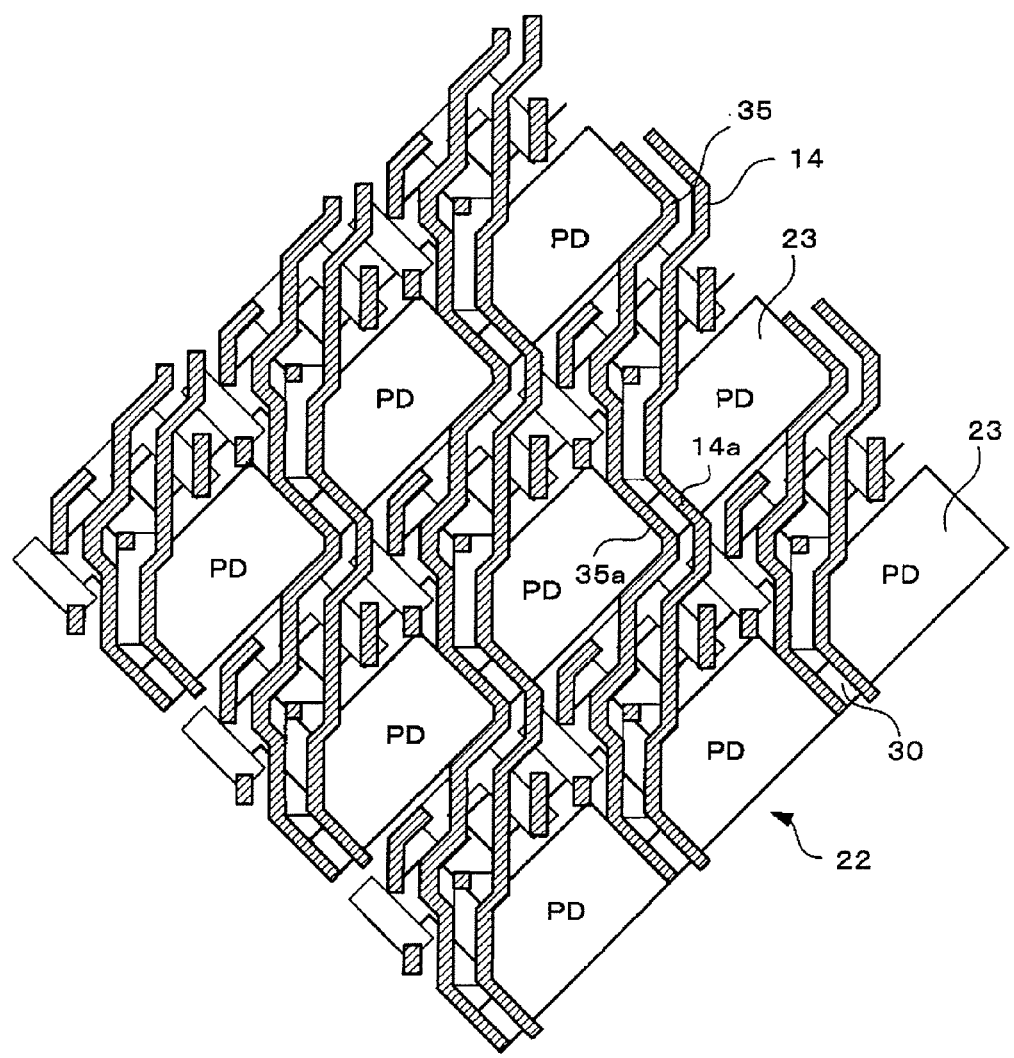
FIG. 4 is a plan view illustrating a detailed configuration of a solid-state image pickup device having a first-layer metal wiring arranged in the vertical direction according to an embodiment of the present invention.
Figure 5:
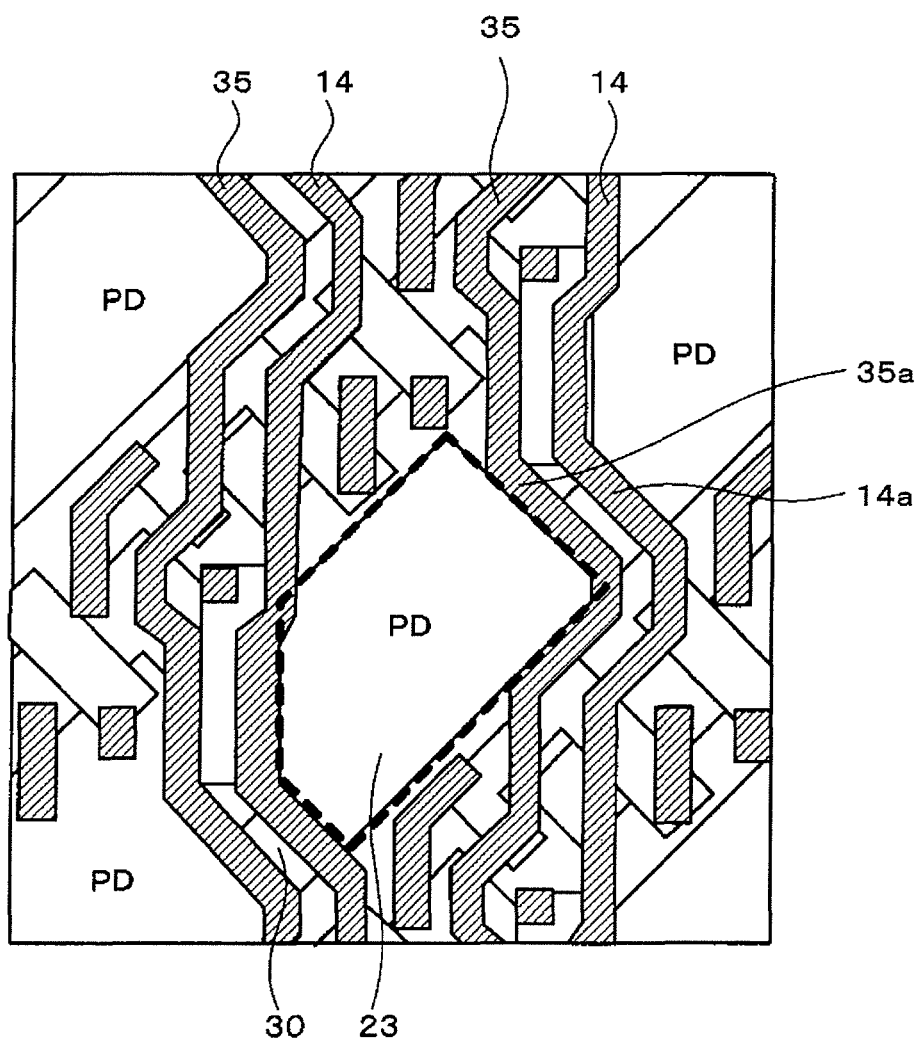
FIG. 5 is an enlarged view of a part shown in FIG. 4.

FIG. 4 and FIG. 5 (an enlarged view of a part of FIG. 4) illustrate an example of a layout of the first layer metal wiring which is disposed on the semiconductor substrate via the interlayer insulating film and extends in the vertical direction. This vertical wiring includes a vertical signal line 14 connected to the source region 29 of the amplifying transistor Tr3 and a well contact line 35 connected to the semiconductor well region (i.e., the well contact 30 in the semiconductor well region) in each of the pixel 24 to stabilize the potential of the semiconductor well region. The vertical signal line 14 and the well contact line 35 are arranged in the vertical direction with respect to the image pickup area 22 and pass between the individual adjacent ones of the pixels 24. However, for each of the pixels 24, these lines are linearly diagonally disposed along the sides of the photodiode 23 so as to avoid covering the photodiode 23 as much as possible. Specifically, the vertical signal line 14 and the well contact line 35 have diagonal linear wiring portions 14a and 35a, respectively, each of which extends in the vertical direction and along the sides of the photodiode 23.

Figure 6:
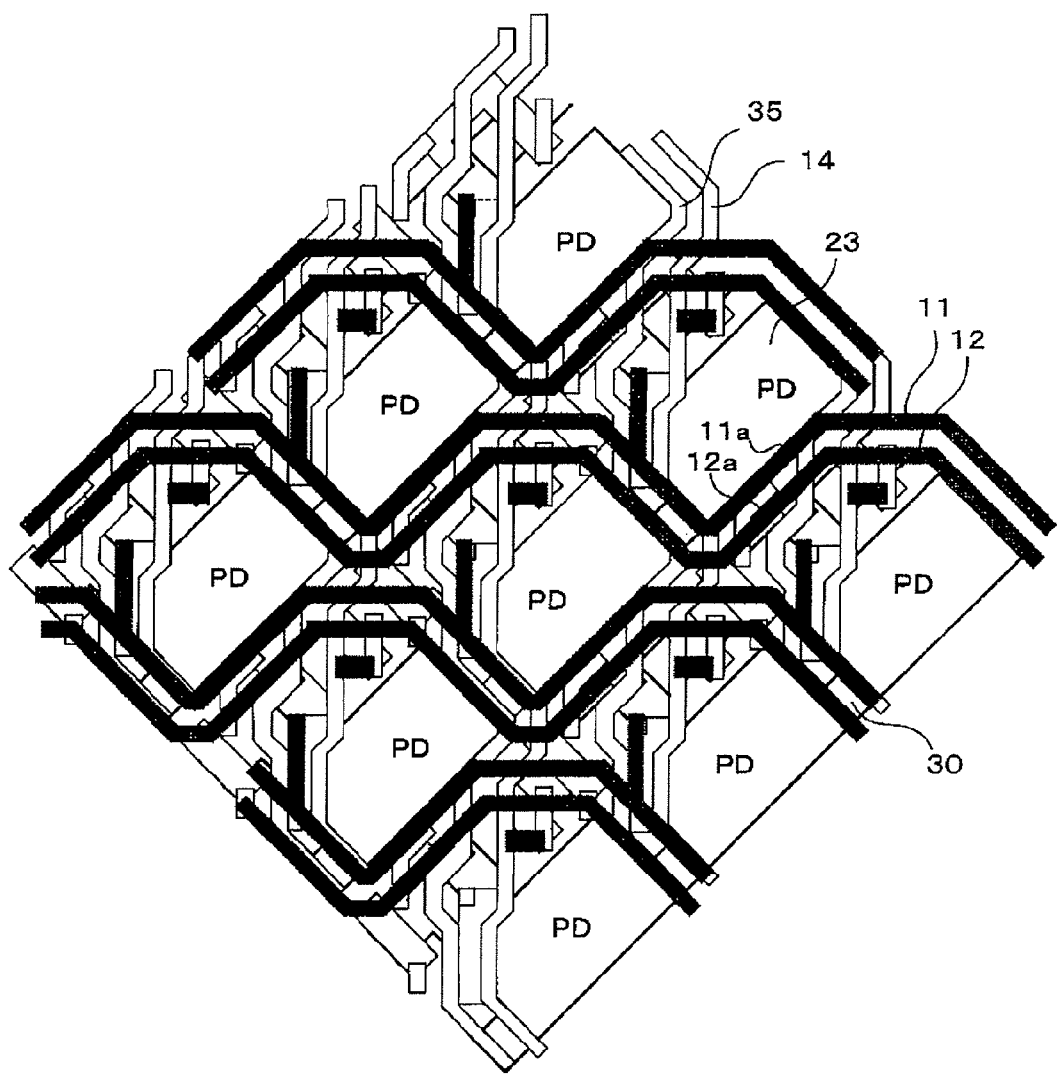
FIG. 6 is a plan view illustrating a detailed configuration of a solid-state image pickup device having a second-layer metal wiring arranged in the horizontal direction according to an embodiment of the present invention.
Figure 7:
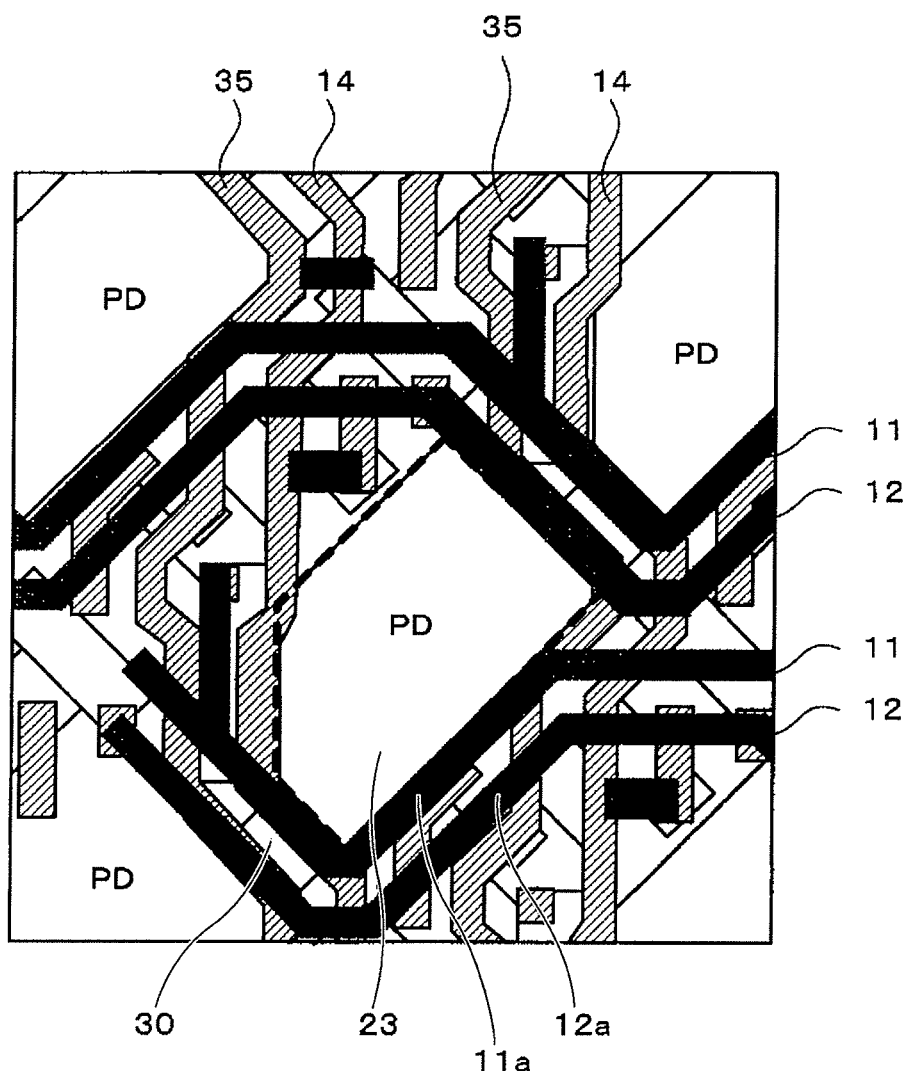
FIG. 7 is an enlarged view of a part shown in FIG. 6.

FIG. 6 and FIG. 7 (an enlarged view of a part of FIG. 6) illustrate an example of a layout of the second-layer metal wiring which is disposed on the first-layer metal wiring having the interlayer insulating film therebetween and extends in the horizontal direction. The horizontal wiring includes a transfer line (a transfer gate line) 11 connected to the gate electrode 31 of the transfer transistor Tr1 and a reset line 12 connected to the gate electrode 32 of the reset transistor Tr2. The transfer line 11 and the reset line 12 are arranged in the horizontal direction with respect to the image pickup area 22 and pass between the adjacent one of the pixels 24. However, for each of the pixels 24, these lines are linearly diagonally disposed along the sides of the photodiodes so as to avoid covering the photodiode 23 as much as possible. Specifically, the transfer line 11 and the reset line 12 have diagonal linear wiring portions 11a and 12a, respectively, each of which extends in the horizontal direction and along the sides of the photodiode 23.

In addition, the third-layer metal wiring disposed on the second-layer metal wiring via the interlayer insulating film serves as a power source wiring. The third-layer metal wiring also serves as a light shielding layer and can be arranged so as to form a grid in which a portion corresponding to the photodiode 23 of each of the pixels 24 opens. This third-layer metal power source wiring can also be linearly arranged.

According to the CMOS sensor 21 of the first embodiment, a diagonal pixel arraying technique is employed to arrange the pixels 24. The layers (i.e., the first-layer metal wiring to third-layer metal wring) of wiring having the interlayer insulating films therebetween are disposed on the semiconductor substrate having the plurality of the pixels 24 thereon. For each of the pixels 24, the vertical signal line 14 and the well contact line 35 of the first-layer metal wiring, which are arranged in the vertical direction with respect to the image pickup area 22, and the transfer line 11 and the reset line 12 of the second-layer metal wiring, which are arranged in the horizontal direction with respect to the image pickup area 22, are linearly obliquely arranged around the photodiode 23 so as to linearly lie along the sides of the photodiode 23 (i.e., these lines 11, 12, 14, and 35 have the diagonal wiring portions 11a, 12a, 14a, and 35a, respectively). This arrangement allows an increase in an optical aperture ratio (substantial light receiving area) of the photodiode 23, and thus the CMOS image sensor 21 with enhanced light collection efficiency and increased sensitivity can be realized.

Further, for each of the pixels 24, the diagonal wiring portions 14a, 35a, 11a, and 12a, which are linearly formed, increase the freedom of the wiring layout, and thus improve the sensitivity and the characteristics such as and a dynamic range of the image sensor. Since the diagonal wiring portions 14a, 35a, 11a, and 12a are arranged linearly and obliquely, the total wiring length can be reduced, and power consumption and heat dissipation can thus be reduced.

Moreover, for each of the pixels 24 with the diagonal wiring portions 14a, 35a, 11a, and 12a, the wiring not obstructing light collection of the photodiode 23 can be provided, and flexibility in the pixel layout is increased. Consequently, an increase in the area of the photodiode 23 can be realized.

The present embodiment described above is preferably applied to CMOS image sensors, particularly having diagonal pixel arrays for which miniaturization of pixels is attempted.

Figure 2:
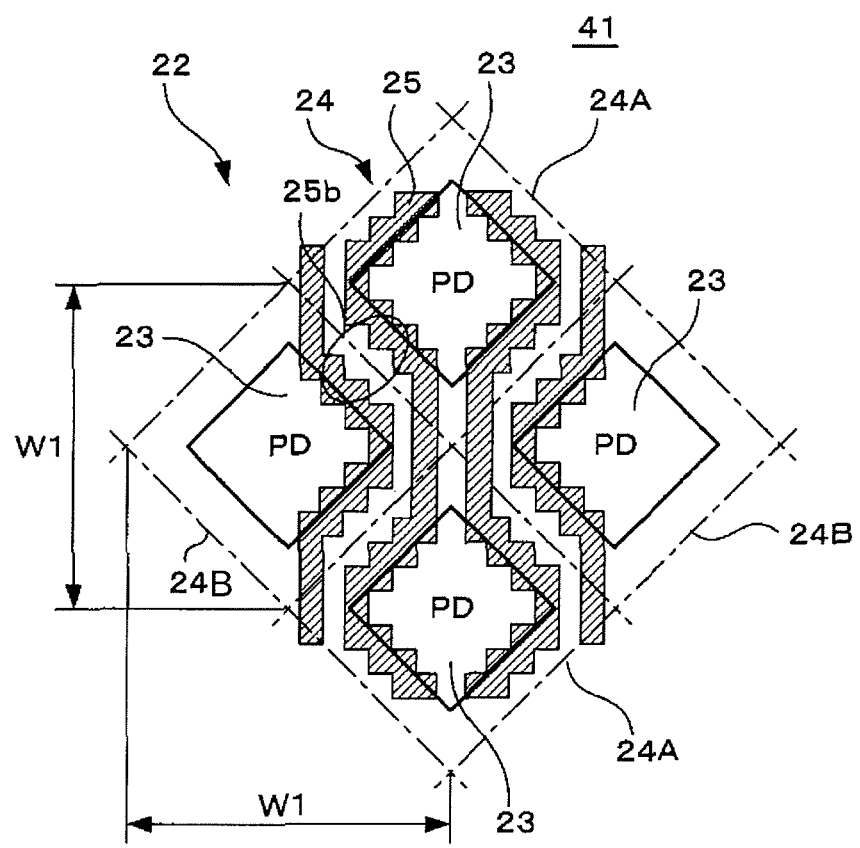
FIG. 2 is a schematic diagram illustrating a wiring layout of a CMOS-type solid-state image pickup device according to an embodiment of the present invention.

FIG. 2 illustrates a solid-state image pickup device according to an embodiment of the present invention, that is, a CMOS image sensor 41 according to a second embodiment. The figure schematically illustrates a wiring layout in an image pickup area using an example of lines arranged in the vertical direction. Similarly to the CMOS sensor 21 described above, the CMOS image sensor 41 according to the present embodiment includes a plurality of pixels 24 each having a photodiode (PD) 23 serving as a photoelectric conversion unit and a plurality of MOS transistors (not shown). The pixels 24 are two-dimensionally and diagonally arranged forming a so-called diagonal pixel array. Specifically, the CMOS image sensor 41 includes a first pixel group 23A, which includes a plurality of pixels 24A two-dimensionally arranged in a grid-like pattern at a predetermined pitch W1 in vertical and horizontal directions, and a second pixel group, which includes a plurality of pixels 24B two-dimensionally arranged in a similar grid-like pattern. Each of the pixels 24B of the second pixel group is arranged at a position shifted by approximately one-half of the pitch W1 with respect to the individual pixels 24A in vertical and horizontal directions. Thus, the pixels 24A and pixels 24B are arranged to form a square grid which is uniformly obliquely oriented. In this example, the pixels 24A are arranged in the odd-numbered rows of the grid and the pixels 24B are arranged in the even-numbered rows of the grid which are shifted by one-half of the pitch W1 with respect to the odd-numbered rows.

In the present embodiment, for each of the pixels 24, a wiring line 25 extending in the vertical direction with respect to the image pickup area 22 diagonally lies in a zigzag manner along sides of the photodiode 23. Specifically, the line 25 is arranged so as to pass between the photodiode 23 of one of the pixels 24 and the photodiode 23 of an adjacent one of the pixels 24 and to have a diagonal zigzag wiring portion 25b which is disposed along the sides of the photodiode 23 while avoiding covering the photodiode 23 as much as possible. The diagonal zigzag wiring portion 25b can be formed to have alternating vertical and horizontal line sections. However, along with pixel miniaturization, the corners of this zigzag wiring portion with vertical and horizontal line portions may become rounded in the manufacturing process, and thus the zigzag wiring portion may have a wave shape.

Other lines extending in the horizontal directions are similarly arranged so that the lines around the photodiode 23 are diagonally arranged in a zigzag manner along the sides of the photodiode 23, although this is not illustrated in the figure. That is, the line 25 passes between the photodiode 23 of one of the pixels 24 and the photodiodes 23 of an adjacent one of the pixels 24 and has a diagonal zigzag wiring portion 25b which lies along the sides of the photodiode 23 so as to avoid covering the photodiode 23 as much as possible.

Referring to FIG. 8 to FIG. 11, the second embodiment will further be descried. The layout of the pixels 24 are similar to that illustrated in FIG. 3 and the description thereof will be omitted. In FIG. 8 to FIG. 11, the same reference numerals as those used in FIG. 4 to FIG. 7 are used to designate corresponding parts.

Figure 8:
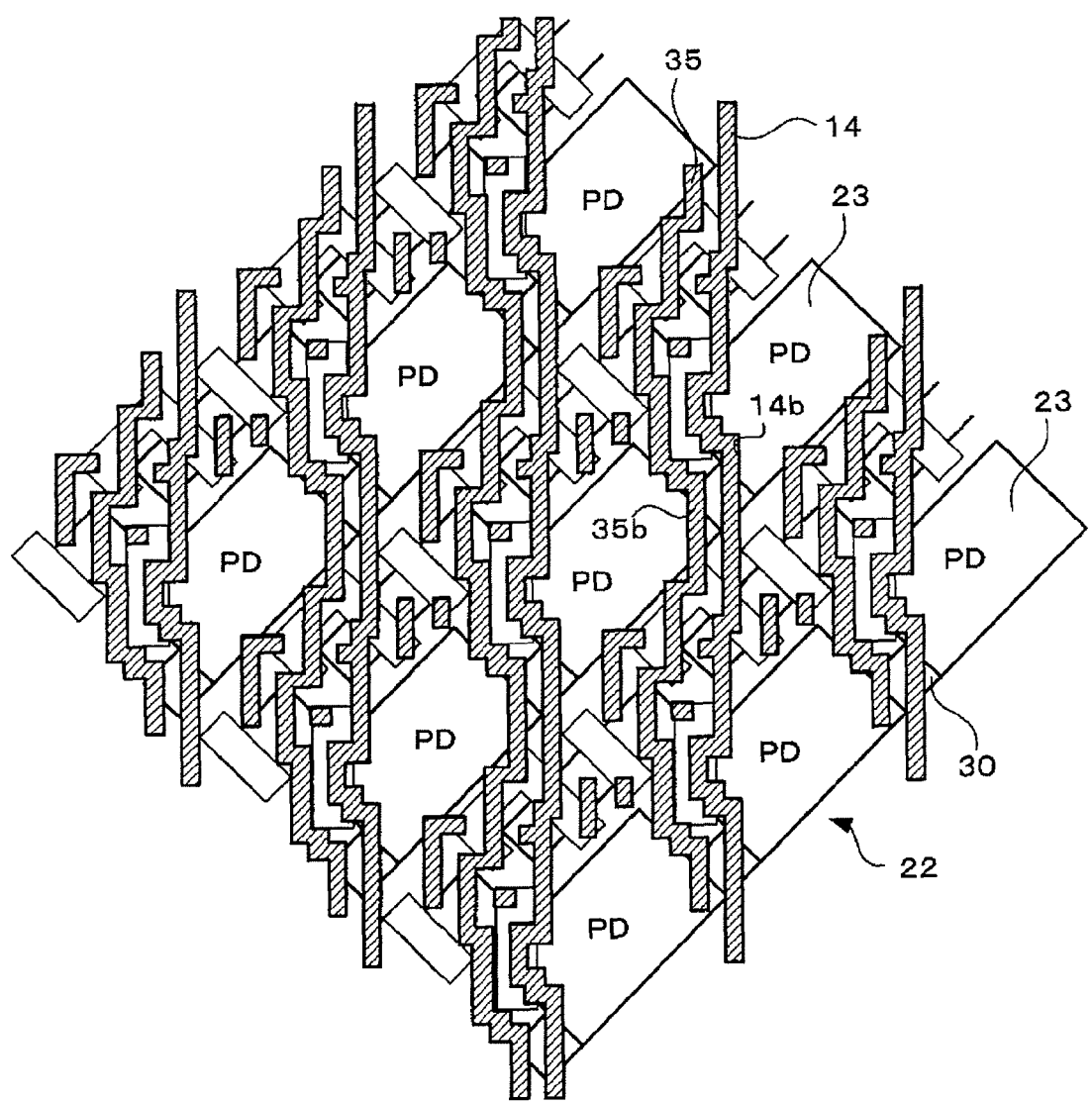
FIG. 8 is a plan view illustrating a detailed configuration of a solid-state image pickup device having a first-layer metal wiring arranged in the vertical direction according to an embodiment of the present invention.
Figure 9:
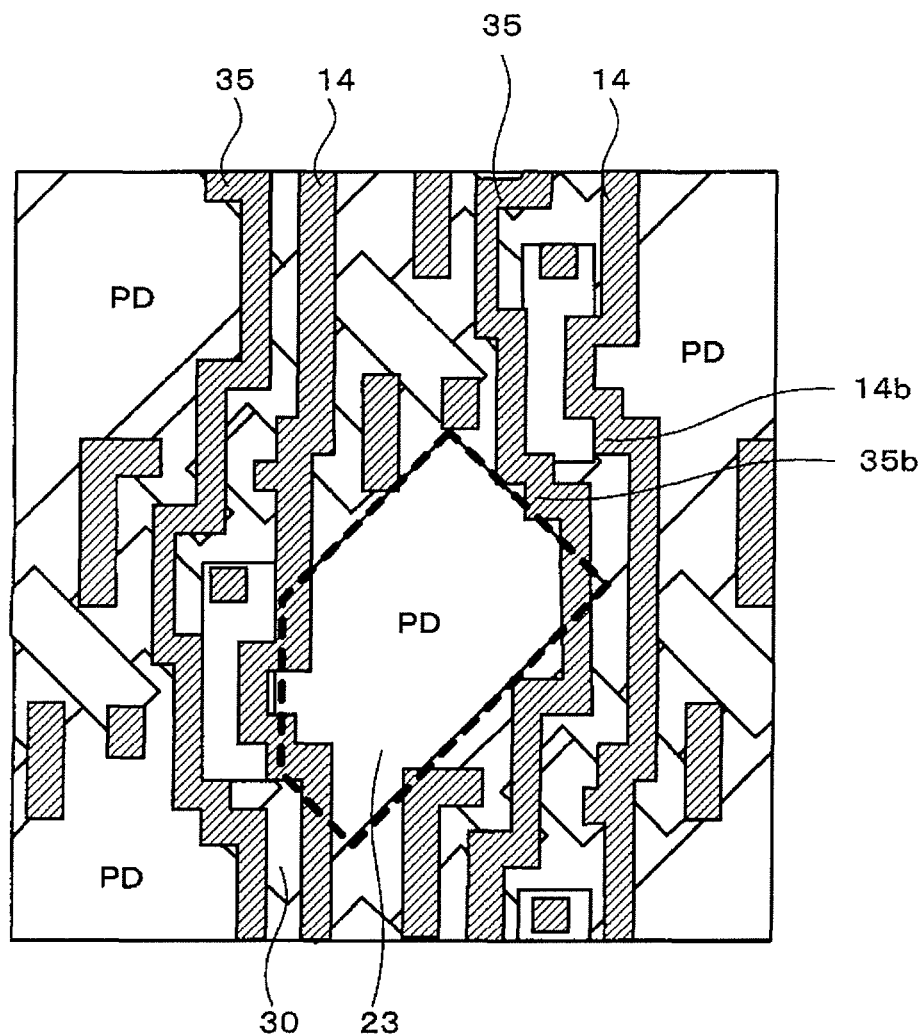
FIG. 9 is an enlarge view of a part shown in FIG. 8.

FIG. 8 and FIG. 9 (an enlarge view of a part of FIG. 8) illustrate an example of a layout of a first-layer metal wiring which extends in the vertical direction. This first-layer metal wiring is disposed on a semiconductor substrate via an interlayer insulating layer. In this example, similar to the first embodiment, for each of the pixels 24, the first-layer metal wiring includes a vertical signal line 14 connected to the source 29 of the amplifying transistor Tri and a well contact line 35 connected to a semiconductor well region in each of the pixels 24 so as to stabilize the potential of the semiconductor well region. The vertical signal line 14 and the well contact line 35 are arranged in the vertical direction with respect to the image pickup area 22 and pass between the photodiode 23 of one of the pixels 24 and the photodiode 23 of an adjacent one of the pixels 24. However, for each of the pixels 24, these lines are diagonally disposed in a zigzag manner along the sides of the photodiode 23 so as to avoid covering the photodiode 23 as much as possible. Specifically, the vertical signal line 14 and the well contact line 35 have diagonal zigzag wiring portions 14a and 35a, respectively, each of which extends in the vertical direction and along the sides of the photodiode 23.

Figure 10:
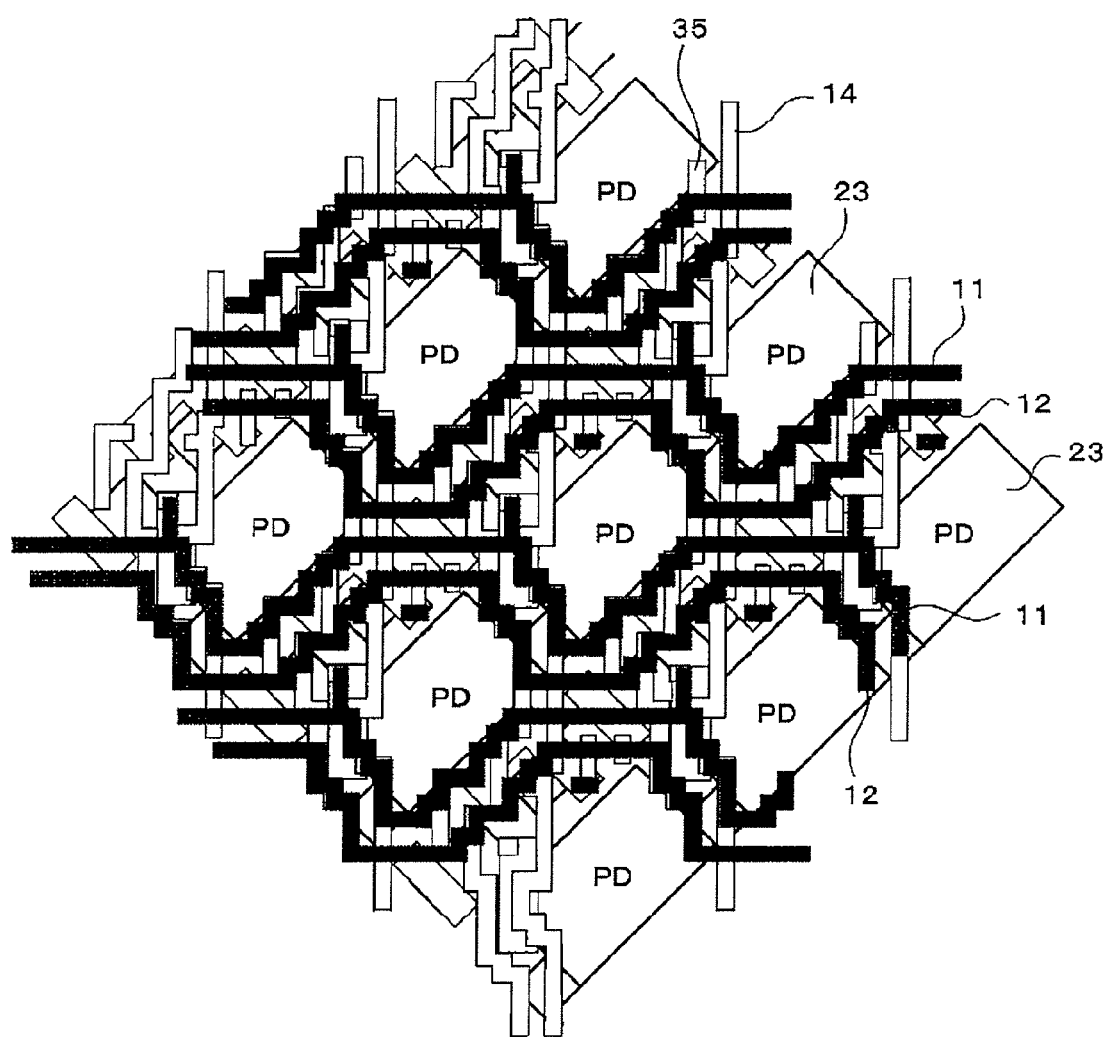
FIG. 10 is a plan view illustrating a detailed configuration of a solid-state image pickup device having a second-layer metal wiring arranged in the horizontal direction.
Figure 11:
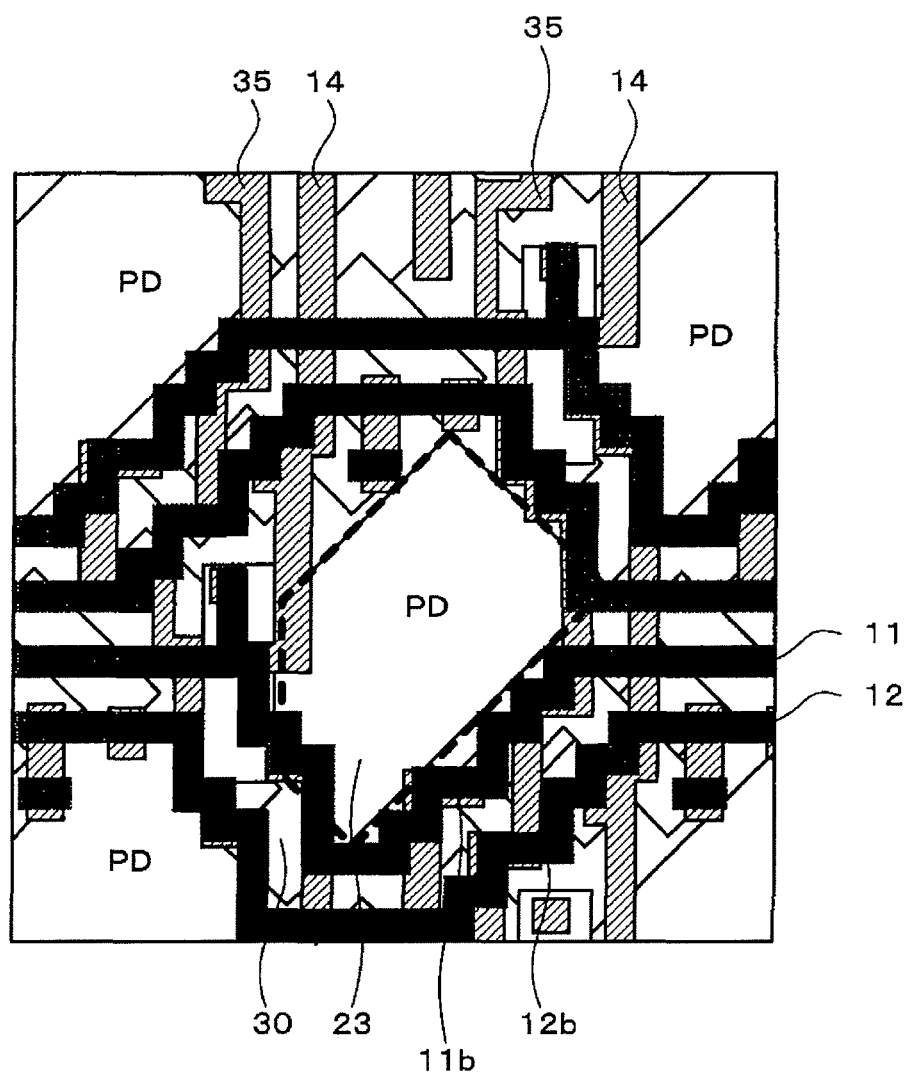
FIG. 11 is an enlarged view.

FIG. 10 and FIG. 11 (an enlarged view of a part of FIG. 10) illustrate an example of a layout of the second-layer metal wiring extending in the horizontal direction, which is disposed on the first-layer metal wiring having the interlayer insulating film therebetween. This second-layer metal wiring includes a transfer line (a transfer gate line) 11 connected to the gate electrode 31 of the transfer transistor Tr1 and a reset line 12 connected to the gate electrode 32 of the reset transistor Tr2. The transfer line 11 and the reset line 12 are arranged in the horizontal direction with respect to the image pickup area 22 and pass between the photodiode 23 of one of the pixels 24 and the photodiode 23 of an adjacent one of the pixels 24. However, in each of the pixels 24, these lines are diagonally disposed forming a zigzag configuration along the sides of the photodiode 23 so as to avoid covering the photodiode 23 as much as possible. Specifically, the transfer line 11 and the reset line 12 have diagonal zigzag wiring portions 11b and 12b, respectively, each of which extends in the horizontal direction and along the sides of the photodiode 23.

In addition, the third-layer metal wiring disposed on the second-layer metal wiring via the interlayer insulating film serves as a power source wiring. The third-layer metal wiring also serves as a light shielding layer and can be arranged so as to form a grid in which a portion corresponding to the photodiode 23 of each of the pixels 24 opens. This third-layer metal power source wiring can also be linearly arranged.

In the CMOS sensor 41 according to the second embodiment, for each of the pixels 24, the vertical signal line 14 and the well contact line 35 of the first-layer metal wiring, which are arranged in the vertical direction with respect to the image pickup area 22, and the transfer line 11 and the reset line 12 of the second-layer metal wiring, which are arranged in the horizontal direction with respect to the image pickup area 22, are diagonally arranged in a zigzag manner around the photodiode 23 so as to lie in a zigzag manner along the sides of the photodiode 23 (i.e., the lines 11, 12, 14, and 35 have the diagonal wiring portions 11b, 12b, 14b, and 35b, respectively). This arrangement allows an increase in the optical aperture ratio (substantial light receiving area) of the photodiode 23, and thus the CMOS image sensor 41 with enhanced light collection efficiency and increased sensitivity can be realized.

Further, the diagonal wiring portions 14b, 35b, 11b, and 12b increases the freedom of the wiring layout, and thus improves the sensitivity and the characteristics such as a dynamic range of the image sensor.

Moreover, with the diagonal wiring portion 14b, 35b, 11b, and 12b, a wiring not obstructing light collection of the photodiode 23 can be provided, and flexibility in the pixel layout can be increased. Consequently, an increase in the area of the photodiode 23 can be realized.

The present embodiment described above is preferably applied to CMOS image sensors, particularly having diagonal pixel arrays for which miniaturization of pixels is attempted.

Figure 12:
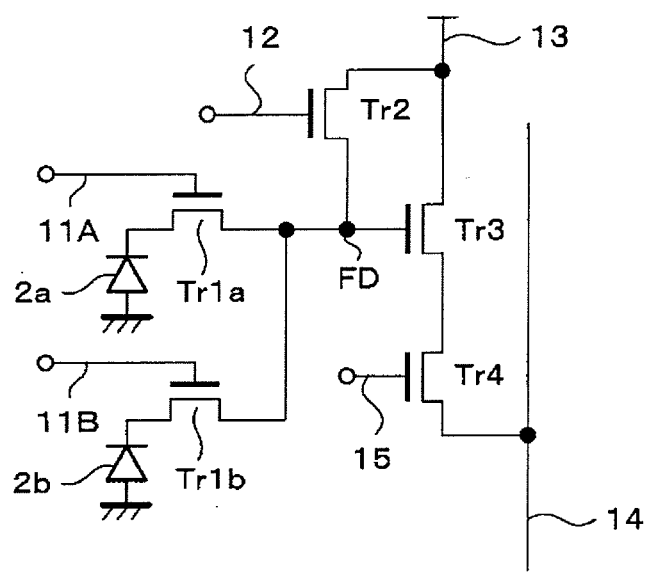
FIG. 12 is a circuit diagram illustrating an equivalent circuit of pixels according to an embodiment of the present invention.

A third embodiment of the present invention can be applied to a CMOS image sensor in which a predetermined pixel transistor is shared by photodiodes corresponding to a plurality of pixels (for example, two pixels, three pixels, four pixels). FIG. 12 illustrates an equivalent circuit of a CMOS image sensor in which a reset transistor Tr2, an amplifying transistor Tr3, and a selection transistor Tr4 are shared by two pixels.

In this CMOS image sensor, photodiodes 2a and 2b for two pixels are connected to the sources of transfer transistors Tr1a and Tr1b, respectively. For each pair of pixels, the gates of the transfer transistors Tr1a and Tr1b are connected to the transfer lines 11A and 11B, respectively. The drains of the transfer transistors Tr1a and Tr1b are commonly connected to the reset transistor Tr2, and a so-called floating diffusion (FD) provided between the drains of the transfer transistors Tr1a and Tr1b and the source of the reset transistor Tr2 is connected to the gate of the amplifying transistor Tr3. The drain of the reset transistor Tr2 and the drain of the amplifying transistor Tr3 are connected to a power source line 13. The gate of the reset transistor Tr2 is connected to a reset line 12. The source of the amplifying transistor Tr3 is connected to the drain of the selection transistor Tr4. The gate of the selection transistor Tr4 is connected to a selection line 15, and the source of the selection transistor Tr4 is connected to a vertical signal line 14.

In the CMOS image sensor according to the third embodiment, MOS transistors are shared by two pixels. In such a configuration, lines, such as the lines 11A, 11B, 12, 14, 15, and a well contact line, extend in the vertical and horizontal direction in each pair of pixels and, when reaching around the photodiodes 2a and 2b, lie diagonally along sides of the photodiodes 2a and 2b.

Figure 13:
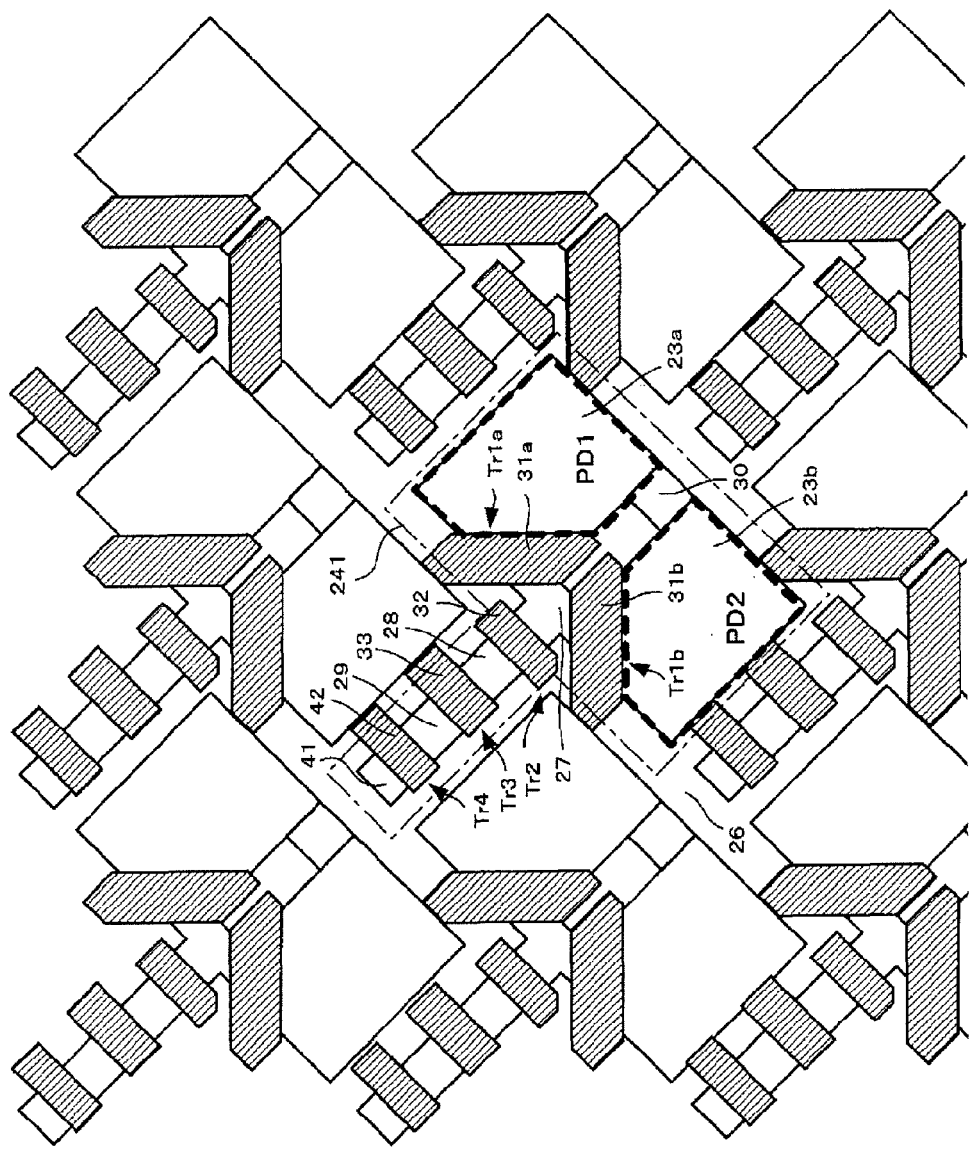
FIG. 13 is a plan view of a detailed configuration of a solid-state image pickup device according to an embodiment of the present invention without wiring.

Referring to FIG. 13 to FIG. 17, examples of layouts of the CMOS image sensor according to the third embodiment will be described in detail. FIG. 13 illustrates a pixel layout in the image pickup area 22.

In this CMOS image sensor according to the present embodiment, a second conductive-type semiconductor well region (for example, a p-type semiconductor well region) is disposed on a first conductive-type semiconductor substrate (for example, an n-type semiconductor silicon substrate). Unit pixels 241 composed of a plurality of pairs of pixels, each pair including two photodiode (PD) 23a and 23b serving as photoelectric conversion units, the transfer transistors Tr1a and Tr1b, the reset transistor Tr2 to be shared by the pairs of pixels, the amplifying transistor Tr3 to be shared by the pairs of pixels, and the selection transistor Tr4 to be shared by the pairs of pixels are disposed two-dimensionally regularly on the p-type semiconductor well region so as to form the diagonal pixel array described above. Device isolation regions 26 are arranged between the adjacent unit pixels 241 and within each of the unit pixels 241. In addition, a well contact is provided in the image pickup area 22 for applying an appropriate potential to the semiconductor well region to stabilize the potential of the region.

For each of the unit pixels 241, the transfer transistor Tr1a and Tr1b include the photodiodes 23a and 24b, respectively, a source/drain region (drain region, in this example) 27 serving as a floating diffusion FD, and transfer gate electrodes 31a and 31b, respectively, on a gate insulating film disposed on the p-type semiconductor well region. The reset transistor Tr2 includes a pair of the source/drain region (source region, in this example) 27 and a source/drain region (drain region, in this example) 28, and a reset gate electrode 32 disposed on the gate insulating film. The amplifying transistor Tr3 includes a pair of the source/drain region (drain region, in this example) 28 and a source/drain region (source region, in this example) 29, and an amplifying gate electrode 33 disposed on the gate insulating film. For each of the unit pixels 241, the selection transistor Tr4 includes a pair of the source/drain region (drain region, in this example) 29, a source/drain region (drain region, in this example) 41, and a selection gate electrode 42 disposed on the gate insulating film.

In this example, a first-layer metal wiring to a third-layer metal wiring are arranged on the semiconductor substrate on which the photodiodes 23a and 23b and the five MOS transistors Tr1a to Tr4 are disposed. An interlayer insulating film is arranged between the individual metal wiring.

Figure 14:
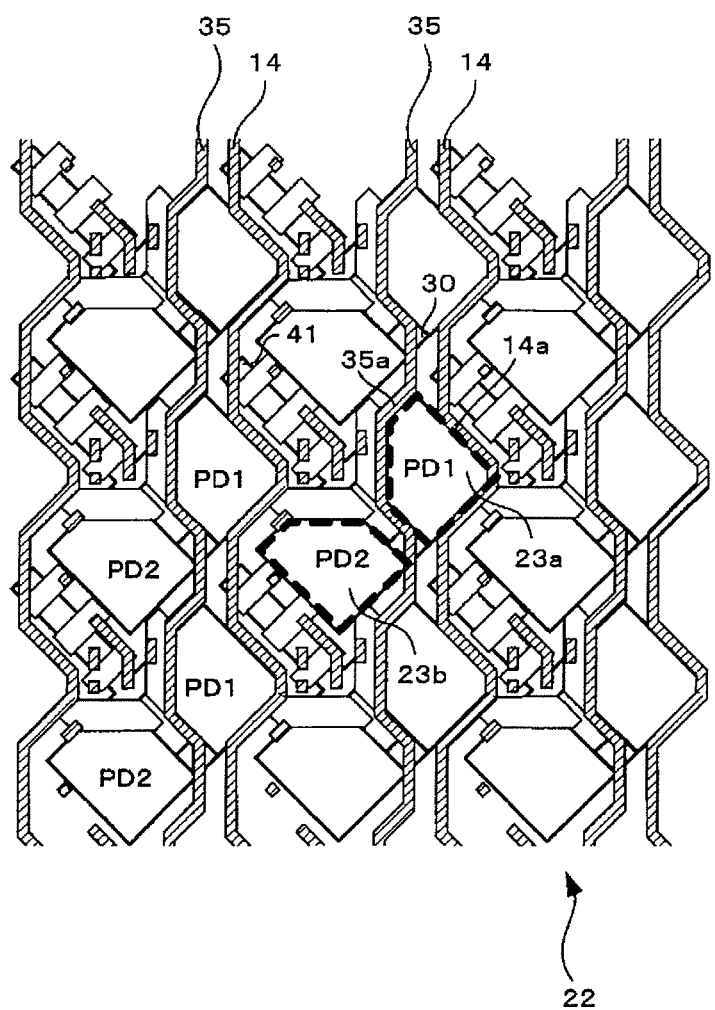
FIG. 14 is a plan view illustrating a detailed configuration of a solid-state image pickup device having a first-layer metal wiring arranged in the vertical direction according to an embodiment of the present invention.
Figure 15:
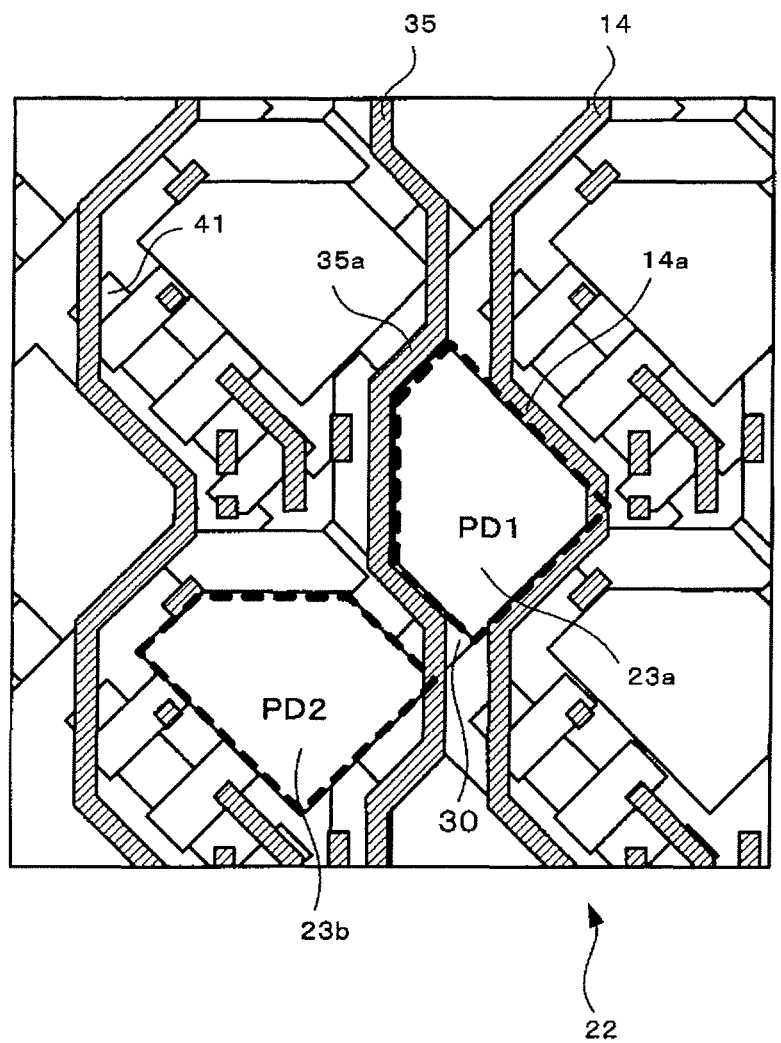
FIG. 15 is an enlarged view of a part shown in FIG. 14.

FIG. 14 and FIG. 15 (an enlarged view of a part of FIG. 14) illustrate an example of a layout of the first layer metal wiring which is disposed on the semiconductor substrate via the interlayer insulating film therebetween and extends in the vertical direction. This first-layer metal wiring includes a vertical signal line 14 connected to the source region 41 of the selection transistor Tr4 and the well contact line 35 connected to the semiconductor well region (i.e., the well contact 30) in each of the unit pixels 241 so as to stabilize the potential of the semiconductor well region. The vertical signal line 14 and the well contact line 35 are arranged in the vertical direction with respect to the image pickup area 22 so as to pass between the photodiodes 23a and 23b (PD1 and PD2, as shown in the figure) and between the photodiodes 23a/23b of one of the unit pixels 241 and the photodiodes 23a/23b of an adjacent one of the unit pixels 241. However, for each of the unit pixels 241, these lines are diagonally linearly disposed along the sides of the photodiodes 23a and 23b so as to avoid covering the photodiodes 23a and 23b as much as possible. Specifically, the vertical signal line 14 and the well contact line 35 have diagonal linear wiring portions 14a and 35a, respectively, each extends in the vertical direction and along the sides of the photodiodes 23a and 23b.

Figure 16:
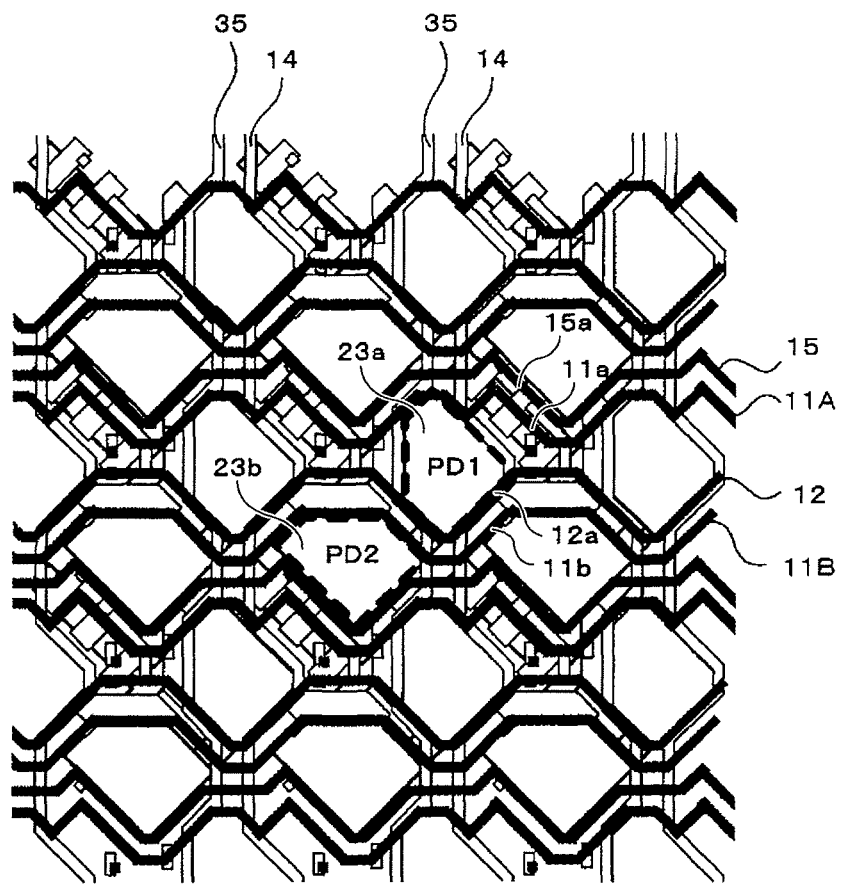
FIG. 16 is a plan view illustrating a detailed configuration of a solid-state image pickup device having a second-layer metal wiring arranged in the horizontal direction according to an embodiment of the present invention.
Figure 17:
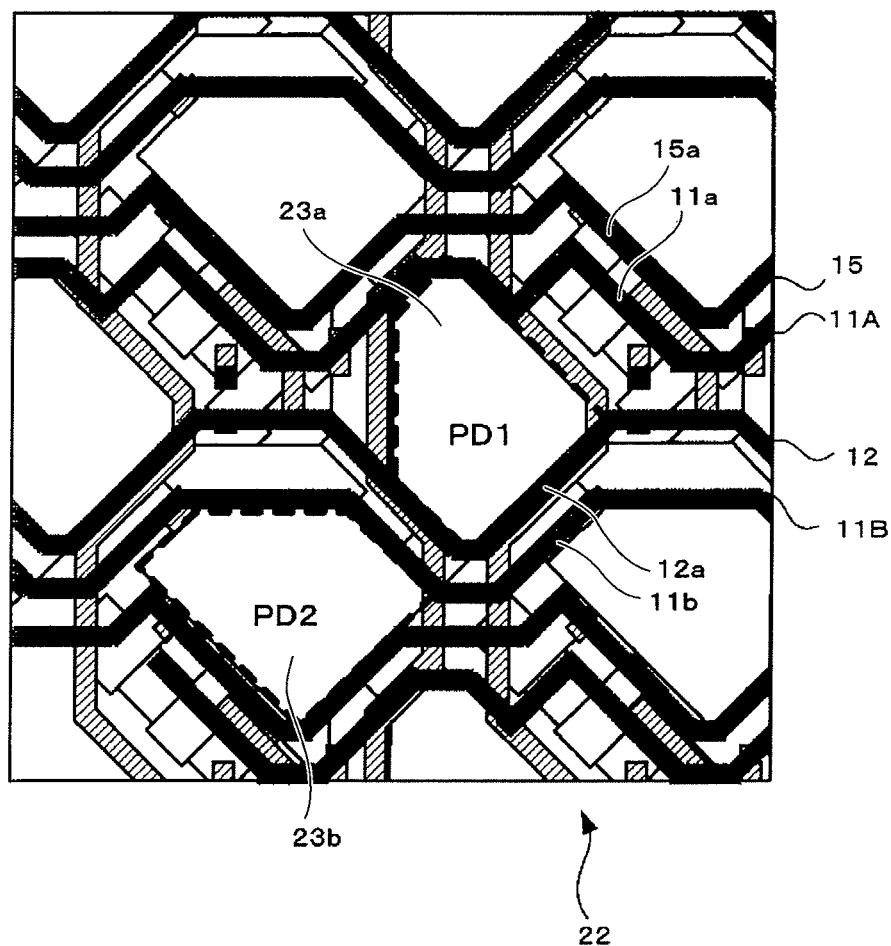
FIG. 17 is an enlarged view of a part shown in FIG. 16.

FIG. 16 and FIG. 17 (an enlarged view of a part of FIG. 16) illustrate an example of a layout of the second-layer metal wiring which is disposed on the first-layer metal wiring via the interlayer insulating film and extends in the horizontal direction. This horizontal wiring includes a transfer line (a transfer gate line) 11A connected to the gate electrode 31a of the transfer transistor Tr1a, a transfer line (a transfer gate line) 11B connected to the gate electrode 31b of the transfer transistor Tr1b, a reset line 12 connected to the gate electrode 32 of the reset transistor Tr2, and a selection line 15 connected to the gate electrode 42 of the selection transistor Tr4. The transfer lines 11A and 11B, the reset line 12, and the selection line 15 are arranged in the horizontal direction with respect to the image pickup area 22 and so as to pass between the photodiodes 23a and 23b (PD1 and PD2, as shown in the figure) and between the photodiodes 23a/23b of one of the unit pixels 241 and the photodiodes 23a/23b of an adjacent one of the unit pixels 241. However, for each of the unit pixels 241, these lines are diagonally and linearly disposed along the sides of the photodiodes 23a and 23b so as to avoid covering the photodiodes 23a and 23b as much as possible. Specifically, the transfer lines 11A and 11B, the reset line 12, and the selection line 15 have diagonal linear wiring portions 11a, 11b, 12a, and 15a, respectively, each of which extends in the horizontal direction and along the sides of the photodiodes 23a and 23b.

In addition, the third-layer metal wiring disposed on the second-layer metal wiring via the interlayer insulating film serves as a power source wiring, although this is not shown in the figure. The third-layer metal wiring also serves as a light shielding layer and can be arranged so as to form a grid in which portions corresponding to each of the photodiodes 23a and 23b open. This third-layer metal power source wiring can be linearly arranged.

According to the CMOS sensor according to the third embodiment, the optical aperture ratios (substantial light receiving area) of the photodiodes 23a and 23b can be increased, and thus the photodiodes with enhanced light collection efficiency and increased sensitivity can be realized. In addition, the sensitivity and other characteristics such as a dynamic range of the image sensor can be improved.

In the case of a plural-pixel configuration, such as the above two-pixel sharing configuration, the number of necessary transistors is smaller than that in the case of the single pixel configuration described above. Thus, the area occupied by photodiodes in an image pickup area can be increased. The number of the lines is reduced due to the reduced number of transistors. However, the wiring density increases with decreasing pixel pitch. Even in this case, the right-receiving aperture ratios of the photodiodes can be increased by linearly arranging the diagonal wiring portions of the individual lines for each of the pixels.

FIG. 18 to FIG. 21 illustrates a fourth embodiment of a CMOS image sensor applying the above configuration, in which the two pixels shares MOS transistors. The layout of the unit pixels 241 are similar to that illustrated in FIG. 13 and the description thereof will be omitted. In FIG. 18 to FIG. 21, the same reference numerals as those used in FIG. 14 to FIG. 17 are used to designate corresponding parts.

Figure 18:
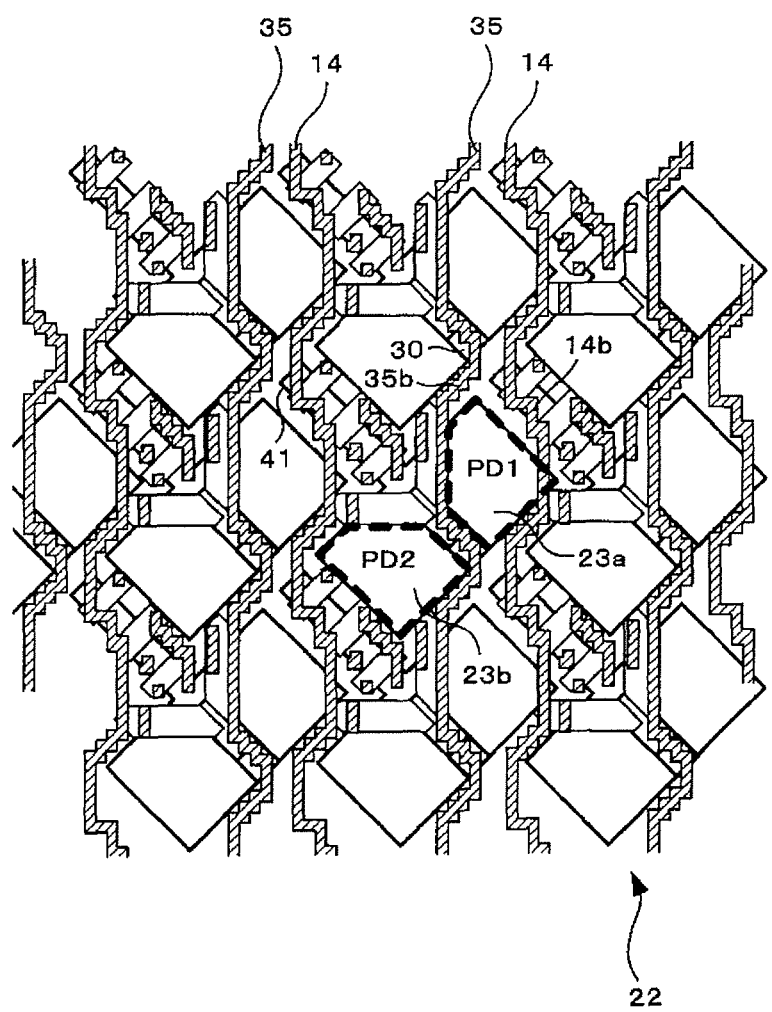
FIG. 18 is a plan view illustrating a detailed configuration of a solid-state image pickup device having a first-layer metal wiring arranged in the vertical direction according to an embodiment of the present invention.
Figure 19:
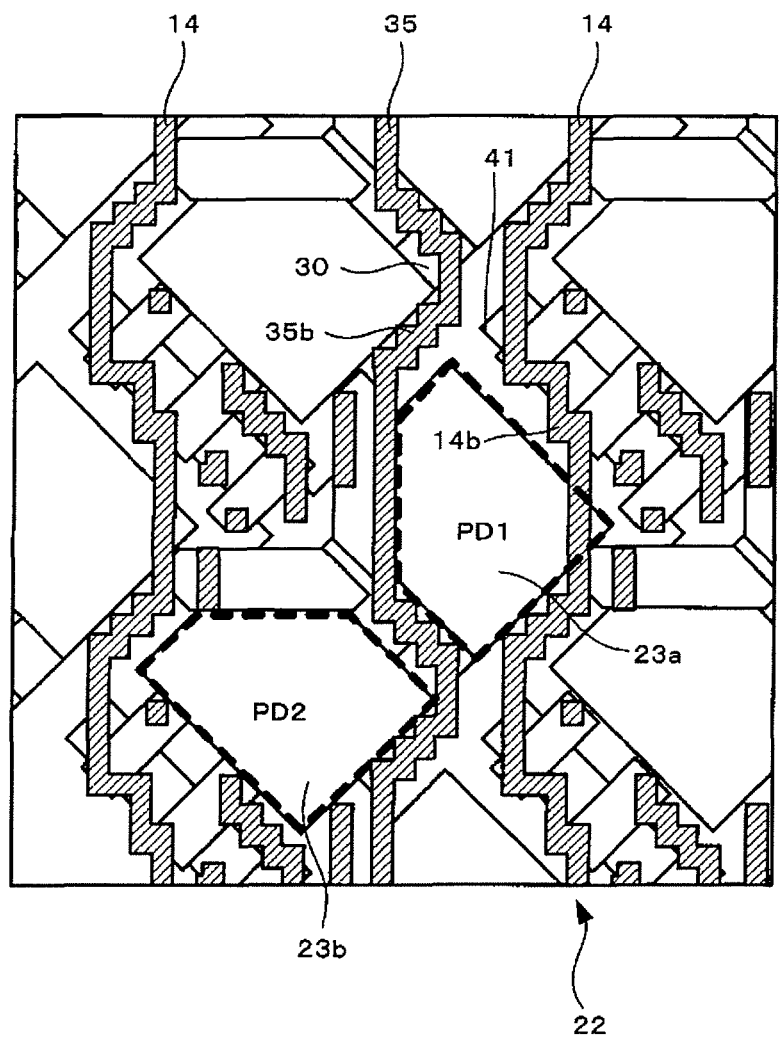
FIG. 19 is an enlarged view of a part shown in FIG. 18.

FIG. 18 and FIG. 19 (an enlarge view of a part of FIG. 18) illustrate an example of a layout of a first-layer metal wiring which extends in the vertical direction. This first-layer metal wiring is disposed on a semiconductor substrate via an interlayer insulating layer. In this example, similar to the third embodiment, the first-layer metal wiring includes a vertical signal line 14 connected to a source region 41 of a selection transistor Tr4 and a well contact line 35 connected to well contact 30 in each of pixels 241 so as to serve to stabilize the potential of a semiconductor well region. The vertical signal line 14 and the well contact line 35 are arranged in the vertical direction with respect to the image pickup area 22 and pass between the photodiodes 23a and 23b (PD1 and PD2, as shown in the figure) and between the photodiodes 23a/23b of one of the unit pixels 241 and the photodiodes 23a/23b of an adjacent one of the unit pixels 241. However, for each of the unit pixels 241, these lines are diagonal disposed in a zigzag manner along sides of the photodiodes 23a and 23b so as to avoid covering the photodiodes 23a and 23b as much as possible. Specifically, the vertical signal line 14 and the well contact line 35 have diagonal zigzag wiring portions 14b and 35b, respectively, each of which extends in the vertical direction and along the sides of the photodiodes 23a and 23b.

Figure 20:
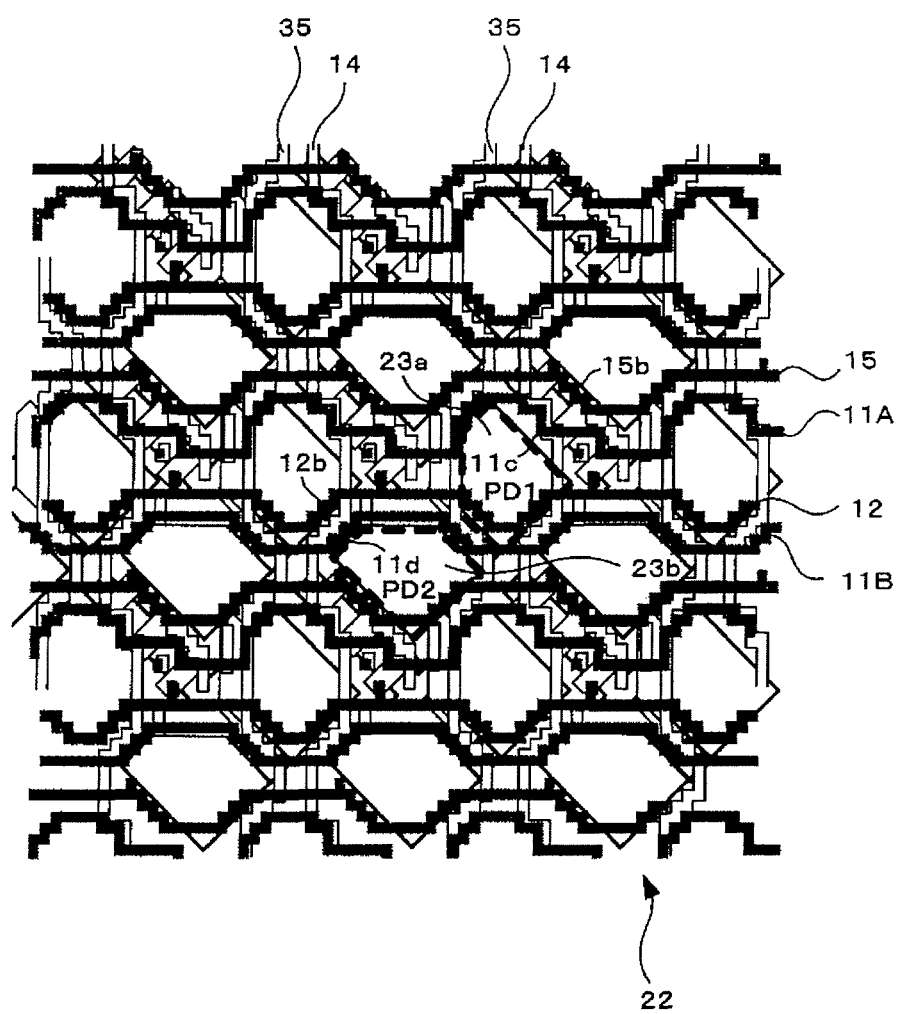
FIG. 20 is a plan view illustrating a detailed configuration of a solid-state image pickup device having a second-layer metal wiring arranged in the horizontal direction according to an embodiment of the present invention.
Figure 21:
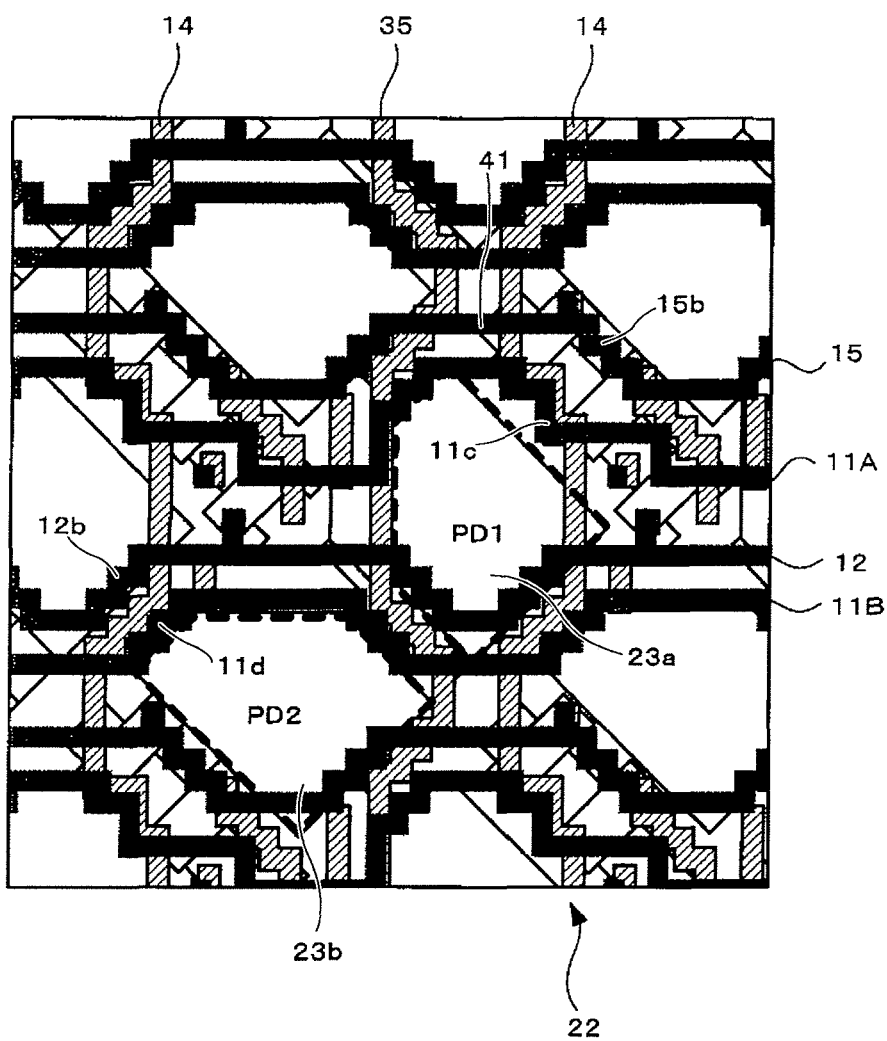
FIG. 21 is an enlarged view of a part shown in FIG. 20.
Figure 22:
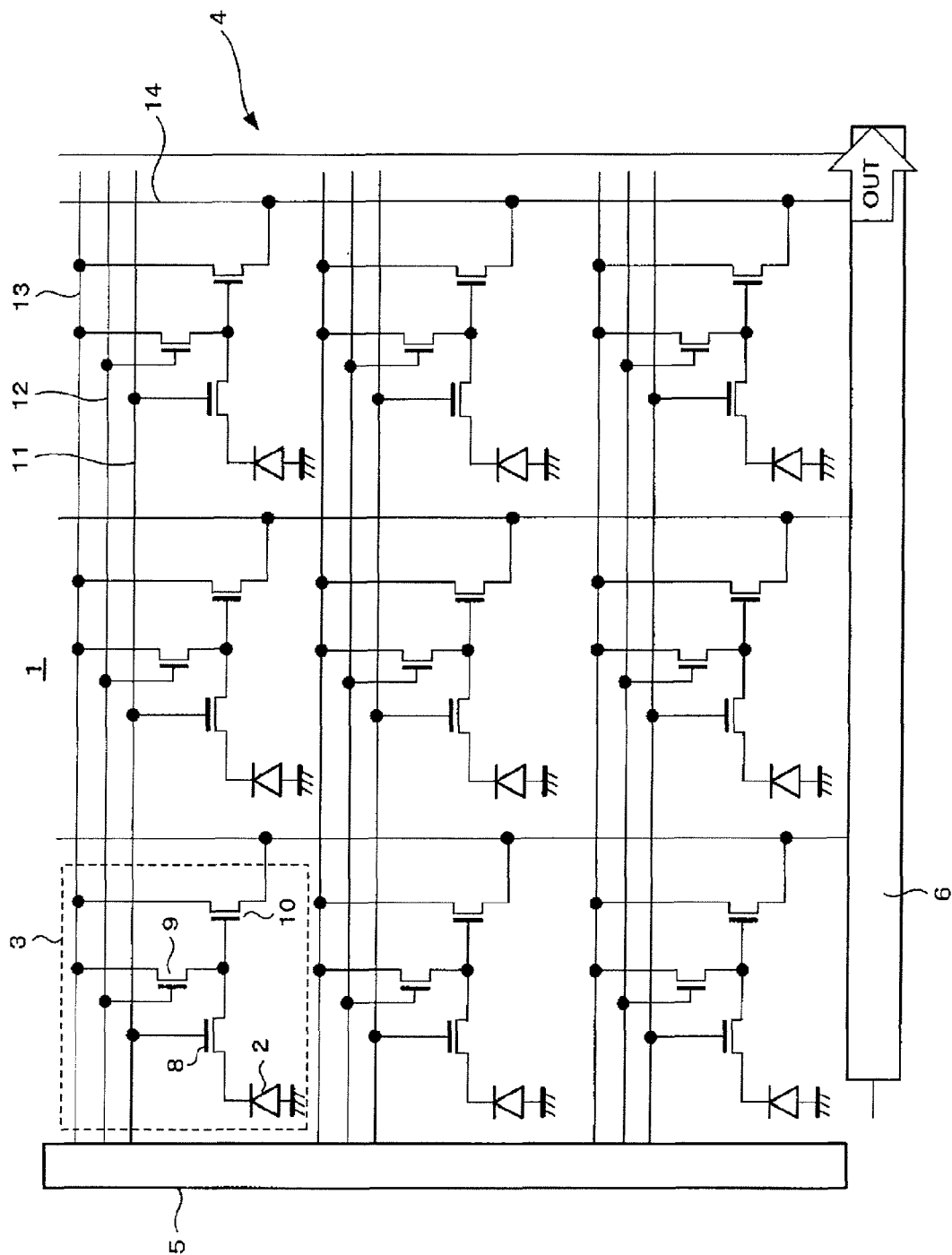
FIG. 22 illustrates an equivalent circuit of a CMOS image sensor.
Figure 23:
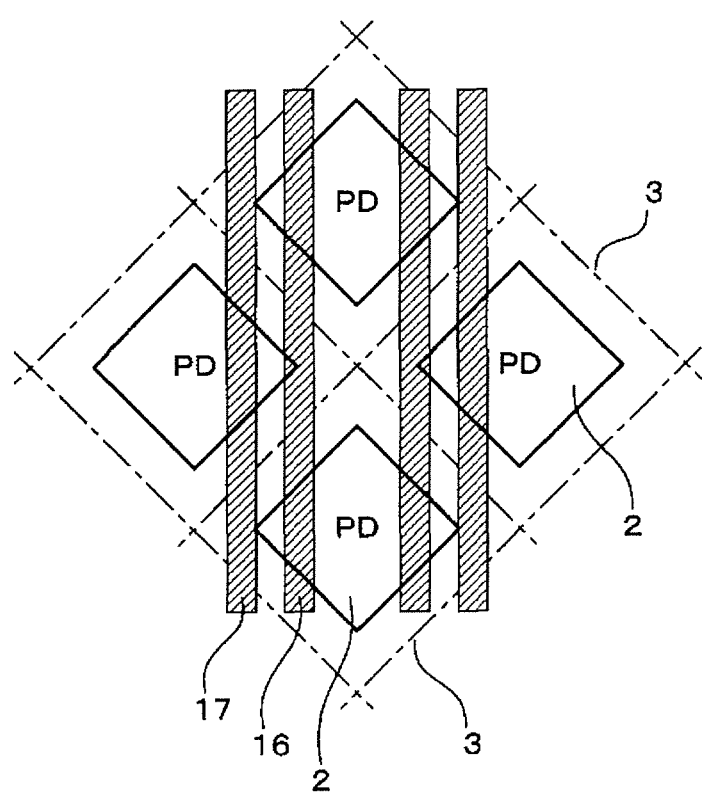
FIG. 23 is a schematic diagram illustrating a wiring layout of a CMOS-type solid-state image pickup device having a known diagonal pixel array.

FIG. 20 and FIG. 21 (an enlarged view of a part of FIG. 20) illustrate an example of a layout of the second-layer metal wiring extending in the horizontal direction, which is disposed on the first-layer metal wiring having the interlayer insulating film therebetween. Similarly to the above third embodiment, this horizontal wiring includes the transfer line (a transfer gate line) 11A connected to the gate electrode 31a of the transfer transistor Tr1a, the transfer line (a transfer gate line) 11B connected to the gate electrode 31b of the transfer transistor Tr1b, the reset line 12 connected to the gate electrode 32 of the reset transistor Tr2b, and the selection line 15 connected to the gate electrode 42 of the selection transistor Tr4. The transfer lines 11A and 11B, the reset line 12, and the selection line 15 are arranged in the horizontal direction with respect to the image pickup area 22 so as to lie between the photodiodes 23a and 23b (PD1 and PD2, as shown in the figure) and between the photodiodes 23a/23b of one of the unit pixels 241 and the photodiodes 23a/23b of an adjacent one of the unit pixels 241. However, around the photodiodes 23a and 23b in each of the unit pixels 241, these lines are diagonally disposed in a zigzag manner along the sides of the photodiodes so as to avoid covering the photodiodes 23a and 23b as much as possible. Specifically, the transfer lines 11A and 11B, the reset line 12, and the selection line 15 have oblique zigzag wiring portions 11c, 11d, 12b, and 15b, respectively, each of which extends in the horizontal direction and along the sides of the photodiodes 23a and 23b.

In addition, the third-layer metal wiring disposed on the second-layer metal wiring via the interlayer insulating film serves as a power source wiring. The third-layer metal wiring also serves as a light shielding layer and can be arranged so as to form a grid in which portions corresponding to the photodiodes 23a and 23b of each of the unit pixels 241 open. This third-layer metal power source wiring can be linearly arranged.

According to the CMOS sensor according to the fourth embodiment, similarly to the above embodiment, the optical aperture ratios (substantial light receiving area) of the photodiodes 23a and 23b can be increased, and thus the photodiodes 23a and 23b with enhanced light collection efficiency and increased sensitivity can be realized. In addition, the sensitivity and other characteristics such as a dynamic range of the image sensor can be improved. In the case of a plural-pixel configuration, such as the above two-pixel sharing configuration, the number of necessary transistors is smaller than that in the case of the single pixel configuration described above. Thus, the area occupied by the photodiodes 23a and 23b in the image pickup area 22 can be increased.

In each of the above first and second embodiments, an example is illustrated in which pixel transistors of a CMOS image sensor includes a transfer transistor, a reset transistor, and an amplifying transistor. However, the pixel transistors may be composed of four transistors by preparing a selection transistor in addition to the three transistors, or of more than four transistors. Such an embodiment will have the same effects or advantages as those described in the above embodiments.

In each of the above third and fourth embodiment, an example is illustrated in which pixel transistors for a unit pixel includes a transfer transistor, a reset transistor, an amplifying transistor, and a selection transistor. However, the pixel transistors may be composed of three transistors (for example, transfer transistor, reset transistor, and amplifying transistor) or of four or more transistors. Such an embodiment will also have the same effects or advantages as those described the above embodiments.

In the following, a difference between the CCD image sensor having diagonal wiring disclosed in Japanese Unexamined Patent Application Publication No. 2000-101061, which is described above, and a CMOS image sensor having diagonal wiring according to an embodiment of the present invention will be described.

The diagonal wiring of the CCD image sensor has lined wiring with a polysilicon transfer electrode, and thus can operate without the oblique wiring. Thus, in order to increase a light-receiving aperture ratio, this lined wiring can be omitted. On the other hand, in the case of the CMOS image sensor, a plurality of wiring layers (multilayer configuration) is necessary, and thus the light-receiving aperture ratio cannot be increased by omitting the wiring layers.

In addition, lines in the CCD image sensor are used for driving purpose. In contrast, the CMOS image sensor includes power source lines, vertical signal lines as well as driving lines. Thus, by arranging these lines so that these lines have diagonal wiring portions, the light-receiving ratio will be increased, and the freedom of the wiring layout will also be increased.

In the CMOS image sensor, a transistor, a photodiode, etc., included in a pixel (or N pixels when transistors are shared by N pixels) have to be connected to each other. The lines having the diagonal wiring portions for each pixel include a reset line, a selection line, and a transfer line, which are used for driving purpose, as well as a power source line, a vertical signal line, a well contact line, and lines connecting transistors, photodiodes, and capacitors in pixels. These lines are not necessary in CCD image sensor.

Normally, a CMOS image sensor is configured to have a plurality of wiring layers, as described above. Thus, by employing diagonal wiring portion for a certain pixel structure, the freedom of the wiring layout can be increased, and the number of wiring layers can be decreased without decreasing the light-receiving aperture ratio. Thus, the number of manufacturing processes can be decreased, and shading can be reduced. These advantages in structure may not be enjoyed by CCD image sensors.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
unit pixels comprising a plurality of pairs of pixels, each pair of pixels including two photoelectric conversion units, two transfer transistors, one for each photoelectric conversion unit, a reset transistor shared by each pair of pixels, and a selection transistor shared by each pair of pixels, the unit pixels being diagonally arranged; and
wirings for each of the unit pixels, including a vertical signal line for reading out a signal, a well contact line connected to a well region, two transfer lines each individually connected to one of the transfer transistors, a reset line connected to the reset transistor and a selection line connected to the selection transistor, the vertical signal line and at least one more wiring extends in the vertical direction, the selection line and at least one more wiring extends in the horizontal direction, and at least one portion of at least one of the wirings being arranged so as to pass between two photoelectric conversion units of a single unit pixel, and further wherein the wirings are arranged such that at least one wiring has a plurality separate regions, each separate region extending diagonally along a side of a corresponding pixel and being stepped such that the stepped regions have a plurality lengths extending in alternating directions that are substantially perpendicular.

2. The solid-state image pickup device of claim 1,
wherein for each of the pixels, at least one among a plurality of transistors is shared by a plurality of photoelectric conversion units.

3. The solid-state image pickup device of claim 1, wherein at least one wiring extending in the vertical direction and at least one wiring extending in the horizontal direction are each arranged so as to have portions that pass between two photoelectric conversion units of the single unit pixel.

4. The solid-state image pickup device of claim 3, wherein at the least one wiring extending in the vertical direction and the at least one wiring extending in the horizontal direction are arranged so as to pass between the photoelectric conversion units of one of the unit pixels and the photoelectric conversion units of an adjacent one of the unit pixels.

5. The solid-state image pickup device of claim 1,
wherein the at least one wiring has two separate regions extending diagonally along two sides of a corresponding pixel and being stepped such that the stepped regions have a plurality lengths extending in alternating directions that are substantially perpendicular.

6. The solid-state image pickup device of claim 1,
further comprising two wirings each having a plurality of separate regions, each separate region of each wiring extending diagonally along a side of a corresponding pixel and being stepped such that the stepped regions have a plurality lengths extending in alternating directions that are substantially perpendicular.

7. The solid-state image pickup device of claim 6,
wherein the two wirings each have two separate regions extending diagonally along two sides of a corresponding pixel and being stepped such that the stepped regions have a plurality lengths extending in alternating directions that are substantially perpendicular, the wirings having portions located at opposite sides of a plurality of pixels.

8. The solid-state image pickup device of claim 6,
wherein the two wirings have stepped portions located between two adjacent pixels, the stepped portions being mirrored in a gap area between the two adjacent pixels.

9. A solid-state image pickup device comprising:
unit pixels, the unit pixels being diagonally arranged; and
wirings for each of the unit pixels, including a vertical signal line for reading out a signal, a well contact line connected to a well region, at least one transfer line each individually connected to one of a plurality of transfer transistors, a reset line connected to a reset transistor and a selection line connected to a selection transistor, the vertical signal line and at least one more wiring extends in the vertical direction, the selection line and the at least one more wiring extends in the horizontal direction, and at least one portion of at least one of the wirings being arranged so as to pass between two photoelectric conversion units of a single unit pixel, and further wherein the wirings are arranged such that at least one wiring has a plurality separate regions, each separate region extending diagonally along a side of a corresponding pixel and being stepped such that the stepped regions have a plurality lengths extending in alternating directions that are substantially perpendicular.

10. The solid-state image pickup device of claim 9,
wherein the at least one wiring has two separate regions extending diagonally along two sides of the corresponding pixel and being stepped such that the stepped regions have a plurality lengths extending in alternating directions that are substantially perpendicular.

11. The solid-state image pickup device of claim 9,
further comprising two wirings each having a plurality of separate regions, each separate region of each wiring extending diagonally along a side of the corresponding pixel and being stepped such that the stepped regions have a plurality lengths extending in alternating directions that are substantially perpendicular.

12. The solid-state image pickup device of claim 11,
wherein the two wirings each have two separate regions extending diagonally along two sides of the corresponding pixel and being stepped such that the stepped regions have a plurality lengths extending in alternating directions that are substantially perpendicular, the wirings having portions located at opposite sides of a plurality of pixels.

13. The solid-state image pickup device of claim 11,
wherein the two wirings have stepped portions located between two adjacent pixels, the stepped portions being mirrored in a gap area between the two adjacent pixels.

* * * * *